(12) United States Patent
Zhang et al.

(10) Patent No.: US 11,894,077 B2
(45) Date of Patent: Feb. 6, 2024

(54) SELF-DIAGNOSTIC SMART VERIFY ALGORITHM IN USER MODE TO PREVENT UNRELIABLE ACQUIRED SMART VERIFY PROGRAM VOLTAGE

(71) Applicant: SanDisk Technologies LLC, Addison, TX (US)

(72) Inventors: Ke Zhang, Shanghai (CN); Minna Li, Shanghai (CN); Liang Li, Shanghai (CN)

(73) Assignee: SANDISK TECHNOLOGIES LLC, Addison, TX (US)

( * ) Notice: Subject to any disclaimer, the term of this patent is extended or adjusted under 35 U.S.C. 154(b) by 190 days.

(21) Appl. No.: 17/678,584

(22) Filed: Feb. 23, 2022

(65) Prior Publication Data

US 2023/0268015 A1  Aug. 24, 2023

(51) Int. Cl.
| | |
|---|---|
| G11C 16/34 | (2006.01) |
| G11C 16/10 | (2006.01) |
| G11C 16/30 | (2006.01) |
| G11C 16/08 | (2006.01) |
| G11C 16/26 | (2006.01) |

(52) U.S. Cl.
CPC .......... G11C 16/3459 (2013.01); G11C 16/08 (2013.01); G11C 16/102 (2013.01); G11C 16/26 (2013.01); G11C 16/30 (2013.01)

(58) Field of Classification Search
CPC ... G11C 16/3459; G11C 16/08; G11C 16/102; G11C 16/26; G11C 16/30; G11C 2029/0411; G11C 11/5628; G11C 16/10; G11C 29/52
See application file for complete search history.

(56) References Cited

U.S. PATENT DOCUMENTS 7,301,817 B2 * 11/2007 Li ................. G11C 16/3454
                                              365/185.24
8,879,318 B2 * 11/2014 Ahn ............... G11C 16/0483
                                              365/185.28

(Continued)

OTHER PUBLICATIONS

U.S. Appl. No. 17/473,183, Programming Techniques to Improve Programming Time and Reduce Programming Errors, Ke Zhang et al., filed Sep. 13, 2021.

*Primary Examiner* — Khamdan N. Alrobaie
(74) *Attorney, Agent, or Firm* — Dickinson Wright PLLC

(57) ABSTRACT

A memory apparatus and operating method are provided. The apparatus includes memory cells connected to word lines and disposed in memory holes and configured to retain a threshold voltage. The memory holes are organized in rows grouped in strings. A control means is coupled to the word lines and the memory holes and programs the memory cells associated with a first one of the strings in a program operation and acquire a smart verify programming voltage in a smart verify operation including smart verify loops. The control means discards the smart verify programming voltage and determines another smart verify programming voltage in another smart verify operation on the memory cells associated with a second one of the strings in response to a quantity of the smart verify loops needed to complete programming of the memory cells associated with the first one of the strings being outside a predetermined threshold criteria.

20 Claims, 21 Drawing Sheets

(56) References Cited

U.S. PATENT DOCUMENTS

| | | | | |
|---|---|---|---|---|
| 8,929,148 B2* | 1/2015 | Kim | ................... | G11C 16/3445 |
| | | | | 365/185.29 |
| 9,142,298 B2 | 9/2015 | Dong et al. | | |
| 9,792,995 B1 | 10/2017 | Shah et al. | | |
| 10,014,063 B2 | 7/2018 | Tseng et al. | | |
| 10,971,240 B1 | 4/2021 | Dunga et al. | | |
| 11,049,578 B1 | 6/2021 | Murai et al. | | |
| 2009/0290427 A1* | 11/2009 | Park | ................... | G11C 16/344 |
| | | | | 365/185.25 |
| 2010/0002506 A1* | 1/2010 | Cho | ................... | G11C 11/5628 |
| | | | | 365/185.09 |
| 2010/0149868 A1* | 6/2010 | Yoo | ................... | G11C 16/3427 |
| | | | | 365/185.24 |
| 2010/0182830 A1* | 7/2010 | Ryu | ................... | G11C 16/349 |
| | | | | 365/185.18 |
| 2014/0185381 A1* | 7/2014 | Lee | ................... | G11C 16/10 |
| | | | | 365/185.11 |
| 2016/0042797 A1* | 2/2016 | Kim | ................... | G11C 16/3427 |
| | | | | 714/764 |
| 2016/0307633 A1* | 10/2016 | Lee | ................... | G11C 16/3454 |
| 2017/0242632 A1* | 8/2017 | Cho | ................... | G06F 3/0655 |

\* cited by examiner

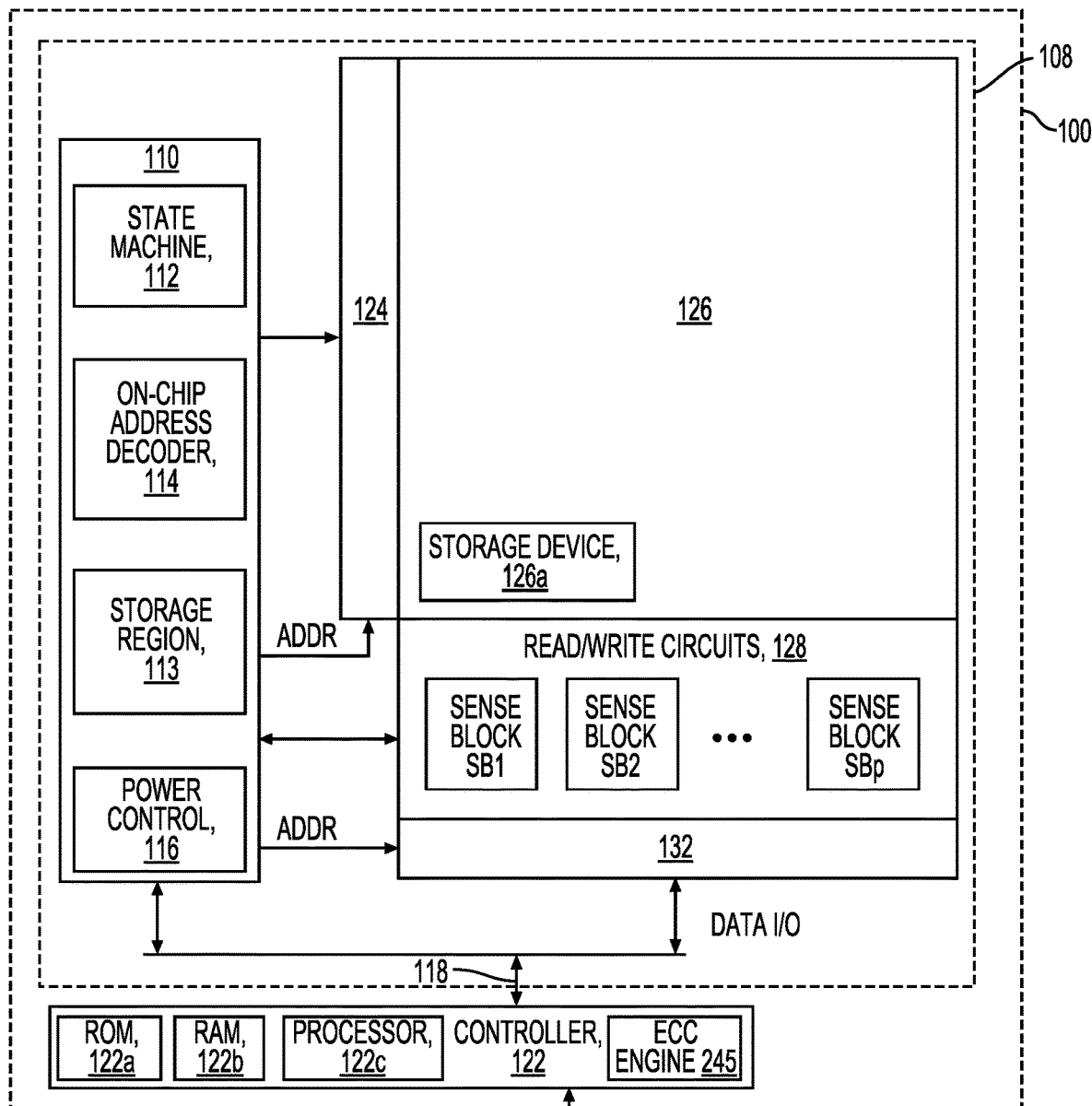
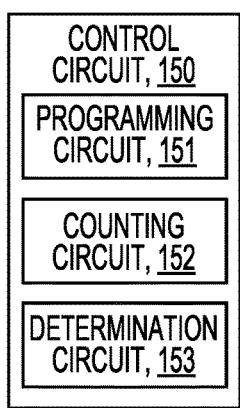
FIG. 1A
FIG. 1B

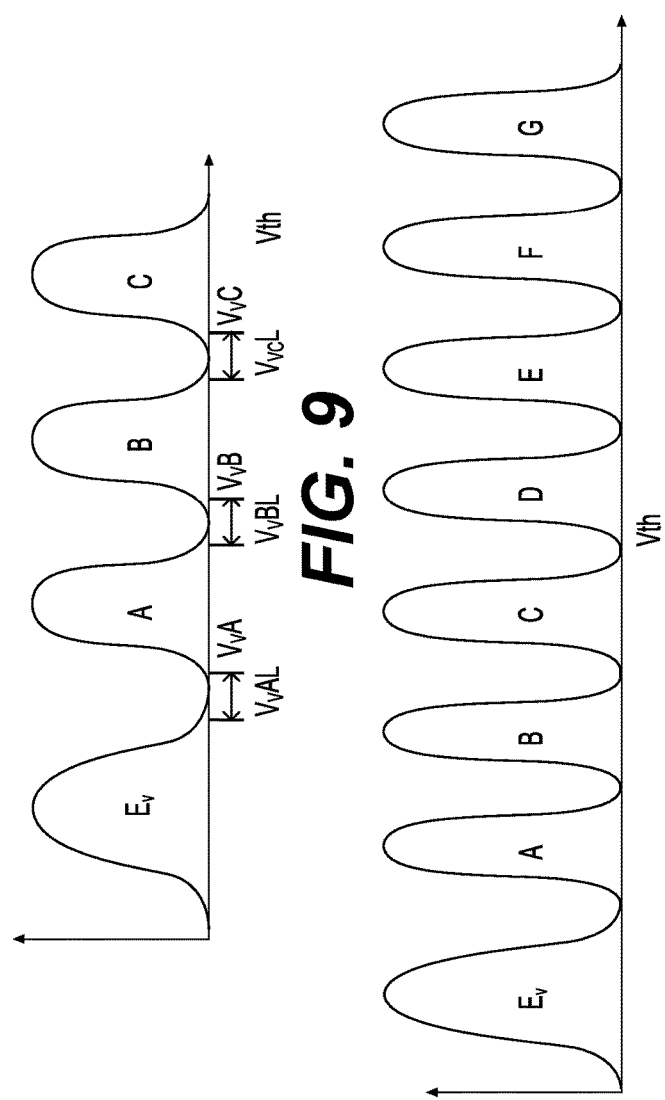
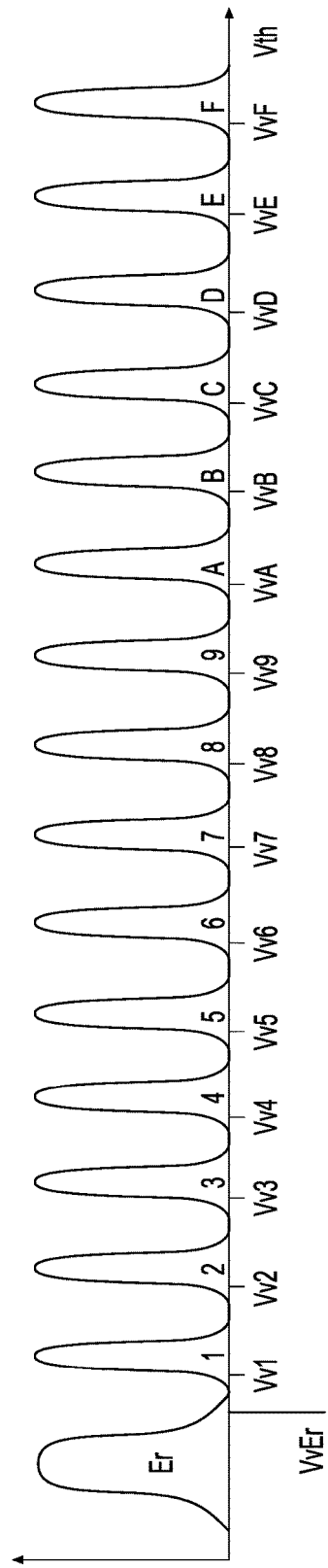
FIG. 9
FIG. 10
FIG. 11

| | Str0 | Str1 | Str2 | Str3 | |
|---|---|---|---|---|---|
| ... | | | | | |
| WL2(n+3) | ACQUIRE4 | APPLY4 | APPLY4 | APPLY4 | |
| WL2(n+2)+1 | APPLY3 | APPLY3 | APPLY3 | APPLY3 | |
| WL2(n+2) | ACQUIRE3 | APPLY3 | APPLY3 | APPLY3 | |
| WL2(n+1)+1 | APPLY2 | APPLY2 | APPLY2 | APPLY2 | |
| WL2(n+1) | ACQUIRE2 | APPLY2 | APPLY2 | APPLY2 | |
| WL2n+1 | APPLY1 | APPLY1 | APPLY1 | APPLY1 | |
| WL2n | ACQUIRE1 | APPLY1 | APPLY1 | APPLY1 | |
| ... | | | | | |

| PARAMETER | PARAMETER DESCRIPTION | |
|---|---|---|
| NLP_SV_U | THE UP LIMIT SV LOOP FOR FINAL ADOPT VPGM_SV | e.g. 5 or 6 loop |
| NLP_SV_L | THE LOW LIMIT SV LOOP FOR FINAL ADOPT VPGM_SV | e.g. 1 loop |

FIG. 19

SELF-DIAGNOSTIC SMART VERIFY ALGORITHM IN USER MODE TO PREVENT UNRELIABLE ACQUIRED SMART VERIFY PROGRAM VOLTAGE

FIELD

The present technology relates to the operation of memory devices.

BACKGROUND

Semiconductor memory devices or apparatuses are widely used in various electronic devices such as laptops, digital audio players, digital cameras, cellular phones, video game consoles, scientific instruments, industrial robots, medical electronics, solid state drives, automotive electronics, Internet of Things (IOT) devices and universal serial bus (USB) devices. Semiconductor memory includes both non-volatile and volatile memory. Non-volatile memory retains stored information without requiring an external power source. Examples of non-volatile memory include flash memory (e.g., NAND-type and NOR-type flash memory) and Electrically Erasable Programmable Read-Only Memory (EEPROM).

A memory apparatus can be coupled to one or more hosts, where one or more interfaces are used to access the memory device. Additionally, the memory apparatus is often managed by a controller, where among several roles, the controller is configured to interface between the host and the memory apparatus.

To improve performance, some memory apparatuses utilize device modes such as smart verify (SV) to reduce programming time. Smart verify can obtain an acquired program voltage from a sampling string to improve program speed during the programming of subsequent strings. However, defects in the memory apparatus can cause the acquired program voltage to either be too high or too low leading to over programming or decreased apparatus performance. Accordingly, there is a need for improved non-volatile memory apparatuses and methods of operation.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells connected to one of a plurality of word lines and disposed in memory holes and configured to retain a threshold voltage corresponding to one of a plurality of data states. The memory holes are organized in rows grouped in a plurality of strings. A control means is coupled to the plurality of word lines and the memory holes and is configured to program the memory cells connected to one of the plurality of word lines and associated with a first one of the plurality of strings in a program operation and acquire a smart verify programming voltage in a smart verify operation including a plurality of smart verify loops. The control means is also configured to discard the smart verify programming voltage and determine another smart verify programming voltage in another smart verify operation on the memory cells associated with a second one of the plurality of strings in response to a quantity of the plurality of smart verify loops needed to complete programming of the memory cells associated with the first one of the plurality of strings being outside a predetermined threshold criteria.

According to another aspect of the disclosure, a controller in communication with a memory apparatus including memory cells connected to one of a plurality of word lines and disposed in memory holes and configured to retain a threshold voltage corresponding to one of a plurality of data states is also provided. The memory holes are organized in rows grouped in a plurality of strings. The controller is configured to instruct the memory apparatus to program the memory cells connected to one of the plurality of word lines and associated with a first one of the plurality of strings in a program operation and acquire a smart verify programming voltage in a smart verify operation including a plurality of smart verify loops. In addition, the controller is configured to instruct the memory apparatus to discard the smart verify programming voltage and determine another smart verify programming voltage in another smart verify operation on the memory cells associated with a second one of the plurality of strings in response to a quantity of the plurality of smart verify loops needed to complete programming of the memory cells associated with the first one of the plurality of strings being outside a predetermined threshold criteria.

According to an additional aspect of the disclosure, a method of operating a memory apparatus is provided. The memory apparatus includes memory cells connected to one of a plurality of word lines and disposed in memory holes and configured to retain a threshold voltage corresponding to one of a plurality of data states, the memory holes organized in rows grouped in a plurality of strings. The method includes the step of programming the memory cells connected to one of the plurality of word lines and associated with a first one of the plurality of strings in a program operation and acquiring a smart verify programming voltage in a smart verify operation including a plurality of smart verify loops. The method also includes the step of discarding the smart verify programming voltage and determining another smart verify programming voltage in another smart verify operation on the memory cells associated with a second one of the plurality of strings in response to a quantity of the plurality of smart verify loops needed to complete programming of the memory cells associated with the first one of the plurality of strings being outside a predetermined threshold criteria.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1A is a block diagram of an example memory device according to aspects of the disclosure;

FIG. 1B is a block diagram of an example control circuit which comprises a programming circuit, a counting circuit, and a determination circuit according to aspects of the disclosure;

FIG. 9 depicts the Vth distributions of memory cells in an example one-pass programming operation with four data states according to aspects of the disclosure;

FIG. 10 depicts the Vth distributions of memory cells in an example one-pass programming operation with eight data states according to aspects of the disclosure;

FIG. 11 depicts the Vth distributions of memory cells in an example one-pass programming operation with sixteen data states according to aspects of the disclosure;

FIG. 19 shows a table including predetermined threshold criteria used to evaluate the quantity of the plurality of smart verify loops according to aspects of the disclosure;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 2:
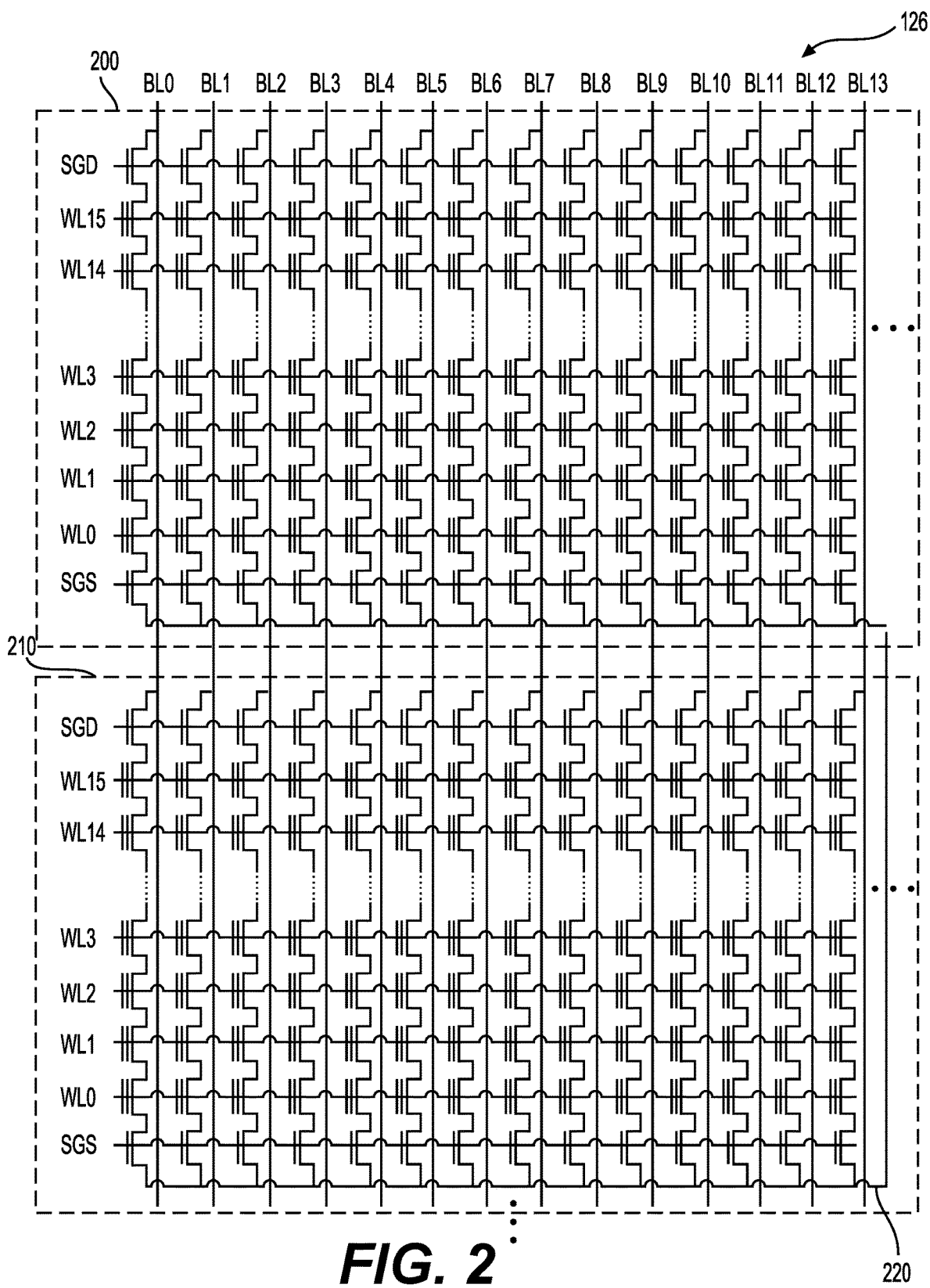
FIG. 2 depicts blocks of memory cells in an example two-dimensional configuration of the memory array of FIG. 1 according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

In some memory devices or apparatuses, memory cells are joined to one another such as in NAND strings in a block or sub-block. Each NAND string comprises a number of memory cells connected in series between one or more drain-side select gate SG transistors (SGD transistors), on a drain-side of the NAND string which is connected to a bit line, and one or more source-side select gate SG transistors (SGS transistors), on a source-side of the NAND string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical strings in a stack, where the stack comprises alternating conductive and dielectric layers. The conductive layers act as word lines which are connected to the memory cells. The memory cells can include data memory cells, which are eligible to store user data, and dummy or non-data memory cells which are ineligible to store user data.

Before programming certain non-volatile memory devices, the memory cells are typically erased. For some devices, the erase operation removes electrons from the floating gate of the memory cell being erased. Alternatively, the erase operation removes electrons from the charge-trapping layer.

A programming operation for a set of memory cells typically involves applying a series of program voltages to the memory cells after the memory cells are provided in an erased state. Each program voltage is provided in a program loop, also referred to as a program-verify iteration. For example, the program voltage may be applied to a word line which is connected to control gates of the memory cells. In one approach, incremental step pulse programming is performed, where the program voltage is increased by a step size in each program loop. Verify operations may be performed after each program voltage to determine whether the memory cells have completed programming. When programming is completed for a memory cell, it can be locked out from further programming while programming continues for other memory cells in subsequent program loops.

Each memory cell may be associated with a data state according to write data in a program command. Based on its data state, a memory cell will either remain in the erased state or be programmed to a data state (a programmed data state) different from the erased state. For example, in a two-bit per cell memory device, there are four data states including the erased state and three higher data states referred to as the A, B and C data states (see FIG. 9). In a three-bit per cell memory device, there are eight data states including the erased state and seven higher data states referred to as the A, B, C, D, E, F and G data states (see FIG. 10). In a four-bit per cell memory device, there are sixteen data states including the erased state and fifteen higher data states referred to as the Er, 1, 2, 3, 4, 5, 6, 7, 8, 9, A, B, C, D, E and F data states (see FIG. 11).

When a program command is issued, the write data is stored in latches associated with the memory cells. During programming, the latches of a memory cell can be read to determine the data state to which the cell is to be programmed. Each programmed data state is associated with a verify voltage such that a memory cell with a given data state is considered to have completed programming when a sensing operation determines its threshold voltage (Vth) is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

The verify voltage which is used to determine that a memory cell has completed programming may be referred to as a final or lockout verify voltage. In some cases, an additional verify voltage may be used to determine that a memory cell is close to completion of the programming. This additional verify voltage may be referred to as an offset verify voltage, and can be lower than the final verify voltage. When a memory cell is close to completion of programming, the programming speed of the memory cell can be reduced such as by elevating a voltage of a respective bit line during one or more subsequent program voltages. For example, in FIG. 9, a memory cell which is to be programmed to the A data state can be subject to verify tests at VvAL, an offset verify voltage of the A data state, and VvA, a final verify voltage of the A data state. By slowing the programming speed just before a memory cell completes programming, narrower Vth distributions can be achieved.

Figures 13, 14:
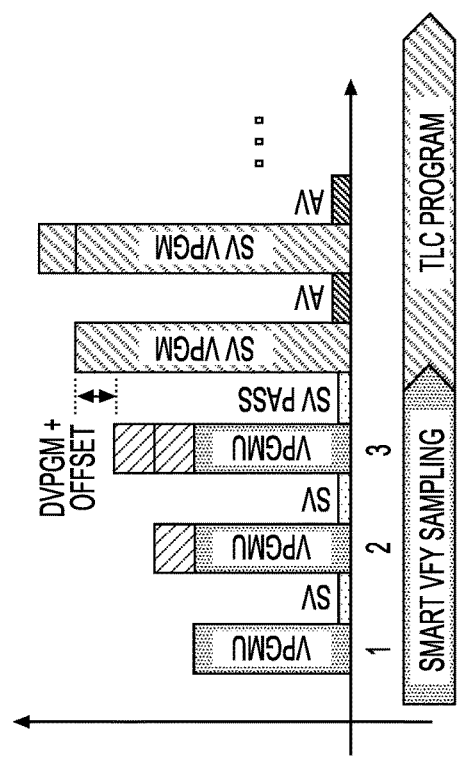
FIG. 13 shows one smart verify algorithm used for triple level cell (TLC) programming according to aspects of the disclosure.
FIG. 14 shows an example smart verify operation utilizing word line skip smart verify according to aspects of the disclosure.
Figure 16:
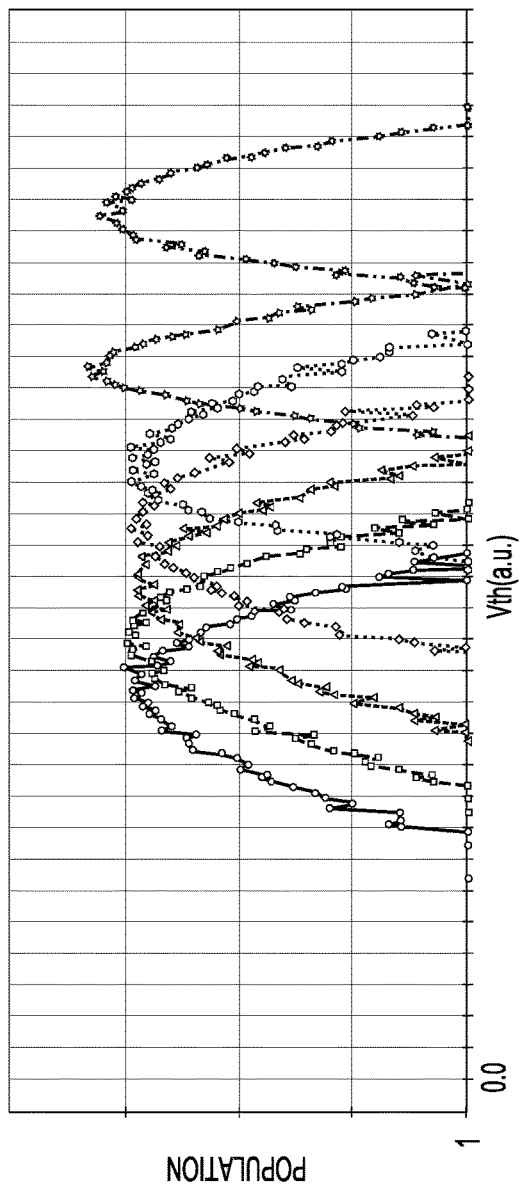
FIG. 16 shows a plot of threshold voltage illustrating another over program failure of the example memory apparatus according to aspects of the disclosure.
Figure 17:
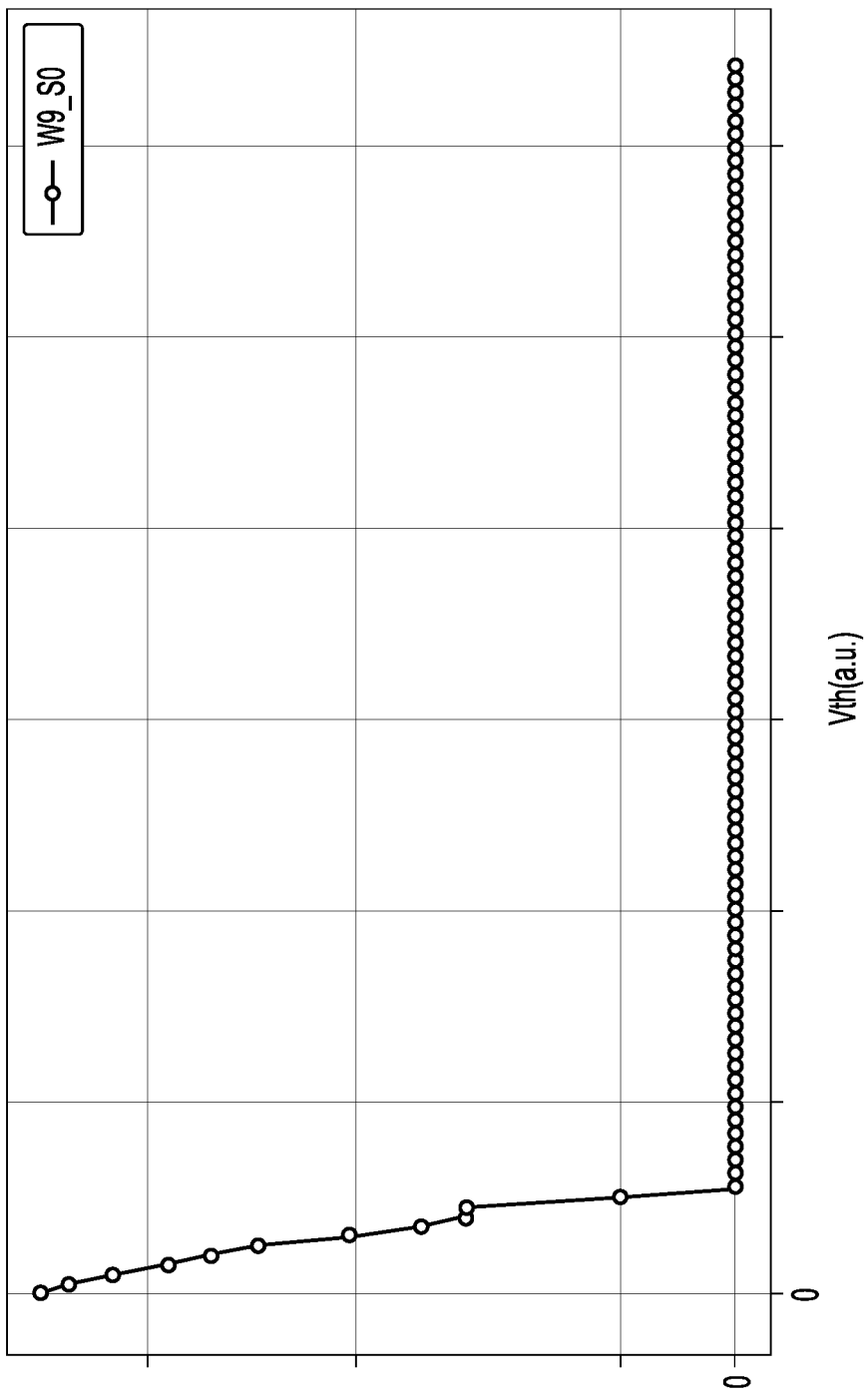
FIG. 17 shows a plot of threshold voltage with an erase tail according to aspects of the disclosure.

Smart verify can improve program time tProg by obtaining an acquired program voltage or smart verify programming voltage VPGM_SV from a sampling string to improve program speed during the programming of subsequent strings. Referring to FIG. 13, during a triple level cell (TLC) program operation, smart verify is performed on the sampling string (WLn string0) to obtain an acquired VPGM_SV. The smart verify programming voltage VPGM_SV is then used for subsequent strings WLn string1/2/3 as an initial program voltage VPGM applied to the word lines during programming. A word line skip smart verify mode may also be used to further reduce program time tProg. As shown in FIG. 14, smart verify is performed on WL2n string0 and the smart verify programming voltage VPGM_SV will be applied to WL2n string1/2/3 and W2n+1 string0/1/2/3. In addition, smart verify on WL4n string0 will be used for WL4n string1/2/3 and WL4n+1/2/3 string0/1/2/3 to further reduce the program time tProg. For good blocks of memory cells, the program time tProg is significantly reduced by enabling smart verify, however, defects in blocks with the sampling string can result in an unreliable smart verify programming voltage VPGM_SV. For instance, an abnormally high smart verify programming voltage VPGM_SV will cause over programming, leading to potential data loss. Specifically, in a single-plane mode, when the abnormally high smart verify programming voltage VPGM_SV is applied to WL4n+1/2/3, WL4n+1/2/3 will be over programmed as shown in FIG. 16. In a multi-plane mode, when Plane0 WL4n suffers from a severe word line leakage induced program failure, the program voltage VPGM of both Plane0 and Plane1 WL4n is pulled down, resulting a higher number of smart verify loops needed to acquire the smart verify programming voltage VPGM_SV. As a result, the acquired abnormal high smart verify programming voltage VPGM_SV will be applied on Plane1 WL4n+1/2/3, inducing an over program issue. In addition, an abnormally low smart verify programming voltage VPGM_SV typically results in an increased program time tProg on subsequent word lines (WLs) using the abnormally low smart verify programming voltage VPGM_SV, decreasing device performance. In more detail, FIG. 17 shows an erase tail on the sampling string during the smart verify acquisition (WL4n/string0). The existence of such an erase tail on the sampling string will result in the abnormally low smart verify programming voltage VPGM_SV, since smart verify can pass at during the first smart verify loop. As a result, the subsequent word lines WL4n+1/2/3 will start programming using the abnormally low smart verify programming voltage VPGM_SV and the number of program loops will be approximately 2-3 loops higher than using a normal smart verify programming voltage VPGM_SV.

FIG. 1A is a block diagram of an example memory device or apparatus. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided, e.g., for verify parameters as described herein.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a programming operation for one set of memory cells, wherein: the one set of memory cells comprises memory cells assigned to represent one data state among a plurality of data states and memory cells assigned to represent another data state among the plurality of data states; the programming operation comprising a plurality of program-verify iterations; and in each program-verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program-verify iteration among the plurality of program-verify iterations in which to perform a verify test for the another data state for the memory cells assigned to represent the another data state.

For example, FIG. 1B is a block diagram of an example control circuit 150 which comprises a programming circuit 151, a counting circuit 152 and a determination circuit 153. The programming circuit may include software, firmware and/or hardware which implements, e.g., steps 1200-1220 of FIG. 12 and/or steps 1300-1328 of FIG. 20.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exists in some cases. The techniques provided herein reduce the likelihood of uncorrectable errors.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 2 depicts blocks of memory cells in an example two-dimensional configuration of the memory array 126 of FIG. 1. The memory array can include many blocks. Each example block 200, 210 includes a number of NAND strings and respective bit lines, e.g., BL0, BL1, . . . which are shared among the blocks. Each NAND string is connected at one end to a drain select gate (SGD), and the control gates of the drain select gates are connected via a common SGD line. The NAND strings are connected at their other end to a source select gate which, in turn, is connected to a common source line 220. Sixteen word lines, for example, WL0-WL15, extend between the source select gates and the drain select gates. In some cases, dummy word lines, which contain no user data, can also be used in the memory array adjacent to the select gate transistors. Such dummy word lines can shield the edge data word line from certain edge effects.

One type of non-volatile memory which may be provided in the memory array is a floating gate memory. See FIGS. 3A and 3B. Other types of non-volatile memory can also be used. For example, a charge-trapping memory cell uses a non-conductive dielectric material in place of a conductive floating gate to store charge in a non-volatile manner. See FIGS. 4A and 4B. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

Figure 3A:
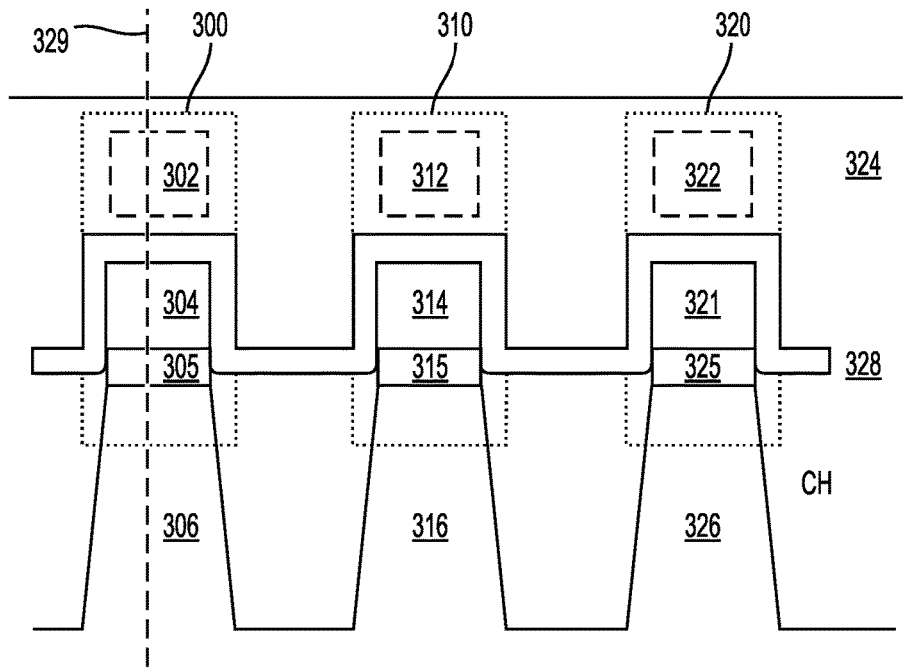
FIG. 3A depicts a cross-sectional view of example floating gate memory cells in NAND strings according to aspects of the disclosure.

FIG. 3A depicts a cross-sectional view of example floating gate memory cells in NAND strings. A bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell is in a different respective NAND string. An inter-poly dielectric (IPD) layer 328 is also depicted. The control gates are portions of the word line. A cross-sectional view along line 329 is provided in FIG. 3B.

Figure 4A:
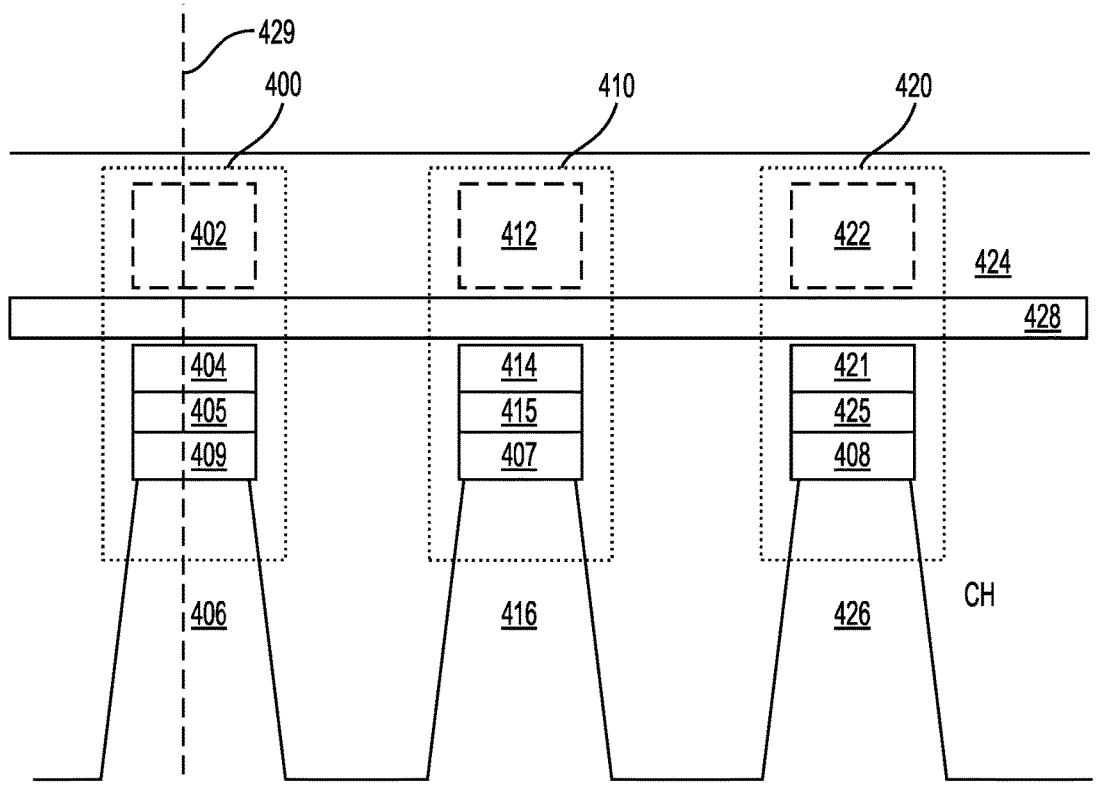
FIG. 4A depicts a cross-sectional view of example charge-trapping memory cells in NAND strings according to aspects of the disclosure.
Figure 4B:
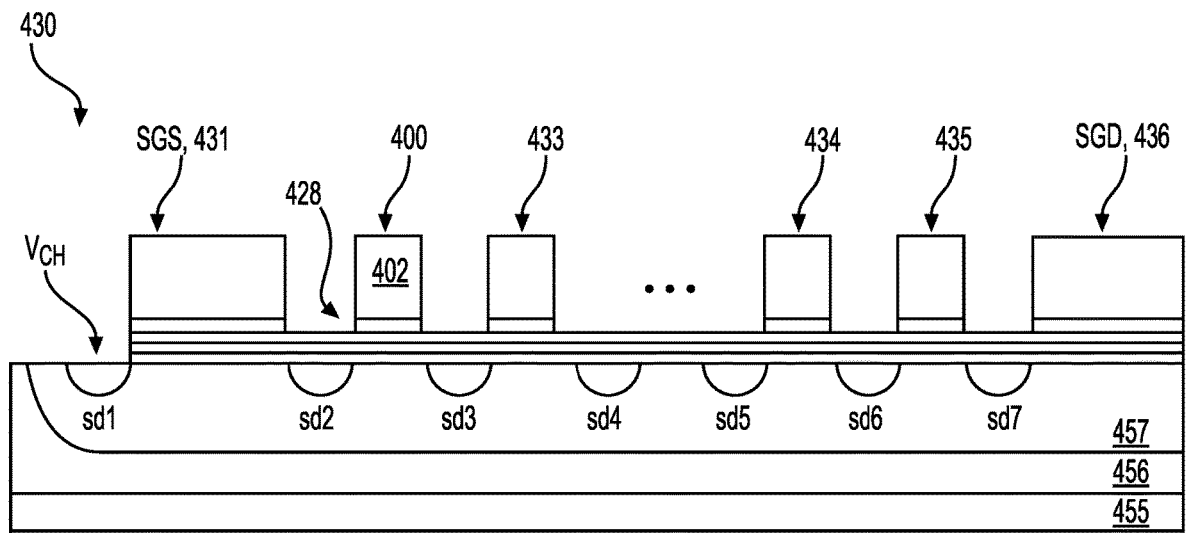
FIG. 4B depicts a cross-sectional view of the structure of FIG. 4A along line 429 according to aspects of the disclosure.

The control gate wraps around the floating gate, increasing the surface contact area between the control gate and floating gate. This results in higher IPD capacitance, leading to a higher coupling ratio which makes programming and erase easier. However, as NAND memory devices are scaled down, the spacing between neighboring cells becomes smaller so there is almost no space for the control gate and the IPD between two adjacent floating gates. As an alternative, as shown in FIGS. 4A and 4B, the flat or planar memory cell has been developed in which the control gate is flat or planar; that is, it does not wrap around the floating gate, and its only contact with the charge storage layer is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

Figure 3B:
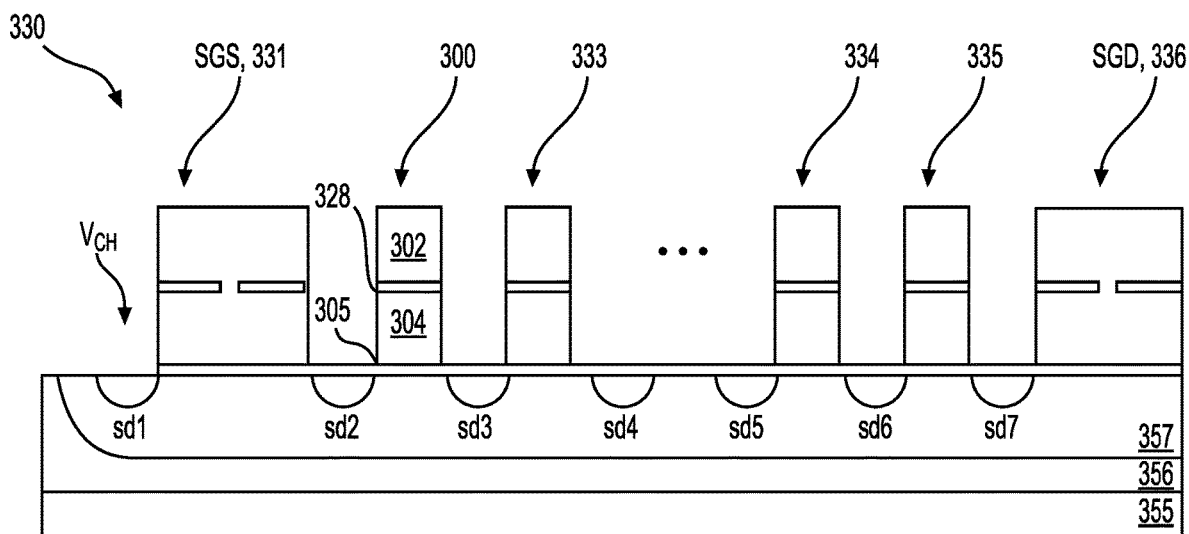
FIG. 3B depicts a cross-sectional view of the structure of FIG. 3A along line 329 according to aspects of the disclosure.

FIG. 3B depicts a cross-sectional view of the structure of FIG. 3A along line 329. The NAND string 330 includes an SGS transistor 331, example memory cells 300, 333, . . . , 334 and 335, and an SGD transistor 336. The memory cell 300, as an example of each memory cell, includes the control gate 302, the IPD layer 328, the floating gate 304 and the tunnel oxide layer 305, consistent with FIG. 3A. Passageways in the IPD layer in the SGS and SGD transistors allow the control gate layers and floating gate layers to communicate. The control gate and floating gate layers may be polysilicon and the tunnel oxide layer may be silicon oxide, for instance. The IPD layer can be a stack of nitrides (N) and oxides (O) such as in a N—O—N—O—N configuration.

The NAND string may be formed on a substrate which comprises a p-type substrate region 355, an n-type well 356 and a p-type well 357. N-type source/drain diffusion regions sd1, sd2, sd3, sd4, sd5, sd6 and sd7 are formed in the p-type well. A channel voltage, Vch, may be applied directly to the channel region of the substrate.

FIG. 4A depicts a cross-sectional view of example charge-trapping memory cells in NAND strings. The view is in a word line direction of memory cells comprising a flat control gate and charge-trapping regions as a 2D example of memory cells in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 424 extends across NAND strings which include respective channel regions 406, 416 and 426. Portions of the word line provide control gates 402, 412 and 422. Below the word line is an IPD layer 428, charge-trapping layers 404, 414 and 421, polysilicon layers 405, 415 and 425 and tunneling layer layers 409, 407 and 408. Each charge-trapping layer extends continuously in a respective NAND string.

A memory cell 400 includes the control gate 402, the charge-trapping layer 404, the polysilicon layer 405 and a portion of the channel region 406. A memory cell 410 includes the control gate 412, the charge-trapping layer 414, a polysilicon layer 415 and a portion of the channel region 416. A memory cell 420 includes the control gate 422, the charge-trapping layer 421, the polysilicon layer 425 and a portion of the channel region 426.

A flat control gate is used here instead of a control gate that wraps around a floating gate. One advantage is that the charge-trapping layer can be made thinner than a floating gate. Additionally, the memory cells can be placed closer together.

FIG. 4B depicts a cross-sectional view of the structure of FIG. 4A along line 429. The view shows a NAND string 430 having a flat control gate and a charge-trapping layer. The NAND string 430 includes an SGS transistor 431, example memory cells 400, 433, . . . , 434 and 435, and an SGD transistor 435.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well 457. A channel voltage, Vch, may be applied directly to the channel region of the substrate. The memory cell 400 includes the control gate 402 and the IPD layer 428 above the charge-trapping layer 404, the polysilicon layer 405, the tunneling layer 409 and the channel region 406.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance.

The SGD and SGS transistors have the same configuration as the memory cells but with a longer channel length to ensure that current is cutoff in an inhibited NAND string.

In this example, the layers 404, 405 and 409 extend continuously in the NAND string. In another approach, portions of the layers 404, 405 and 409 which are between the control gates 402, 412 and 422 can be removed, exposing a top surface of the channel 406.

Figure 5A:
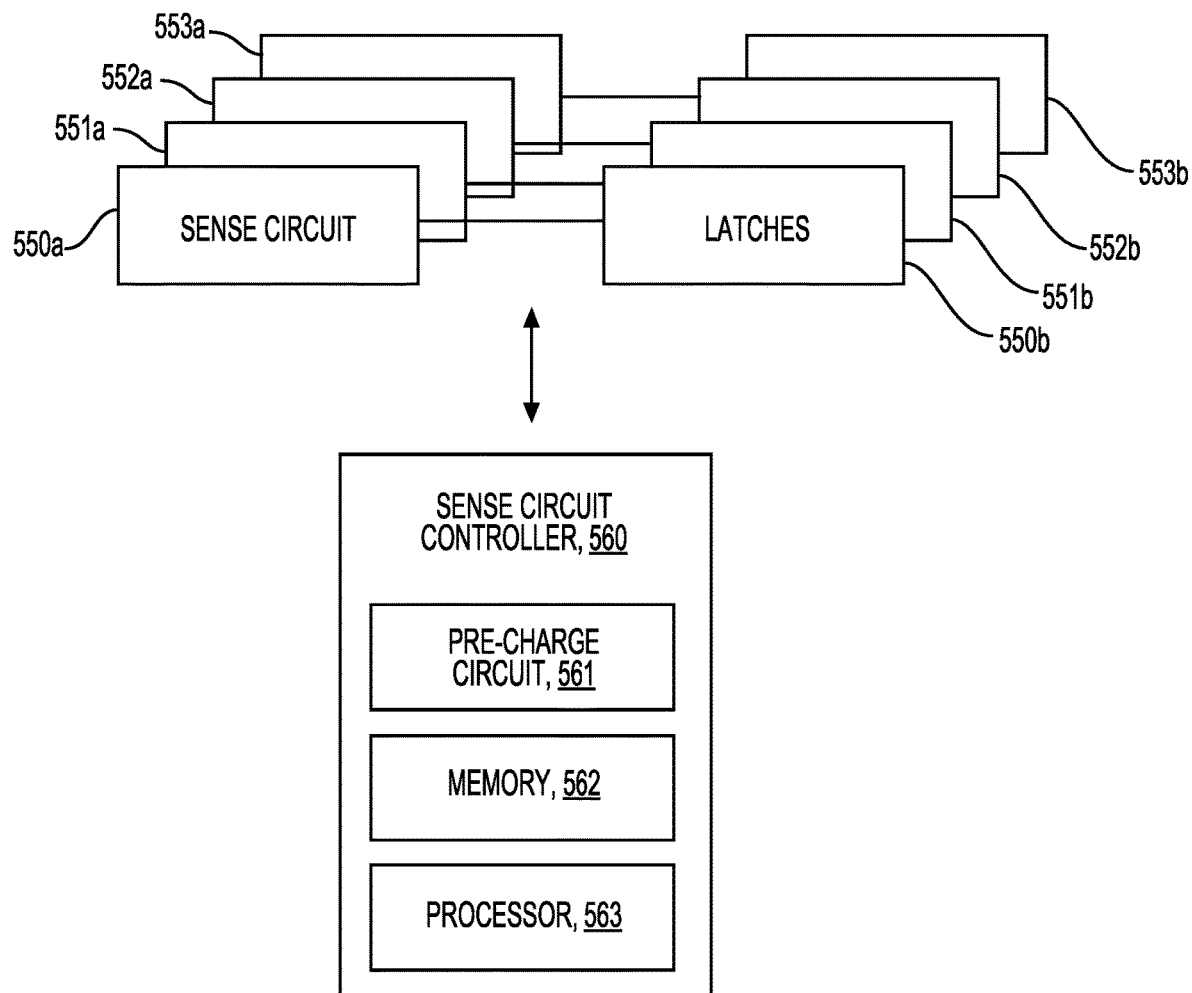
FIG. 5A depicts an example block diagram of the sense block SB1 of FIG. 1 according to aspects of the disclosure.

FIG. 5A depicts an example block diagram of the sense block SB1 of FIG. 1. In one approach, a sense block comprises multiple sense circuits. Each sense circuit is associated with data latches. For example, the example sense circuits 550a, 551a, 552a and 553a are associated with the data latches 550b, 551b, 552b and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller may include a pre-charge circuit 561 which provides a voltage to each sense circuit for setting a pre-charge voltage. In one possible approach, the voltage is provided to each sense circuit independently, e.g., via the data base 503 and a local bus such as LBUS1 or LBUS2 in FIG. 5B. In another possible approach, a common voltage is provided to each sense circuit concurrently, e.g., via the line 505 in FIG. 5B. The sense circuit controller may also include a memory 562 and a processor 563. As mentioned also in connection with FIG. 2, the memory 562 may store code which is executable by the processor to perform the functions described herein. These functions can include reading latches which are associated with the sense circuits, setting bit values in the latches and providing voltages for setting pre-charge levels in sense nodes of the sense circuits. Further example details of the sense circuit controller and the sense circuits 550a and 551a are provided below.

Figure 5B:
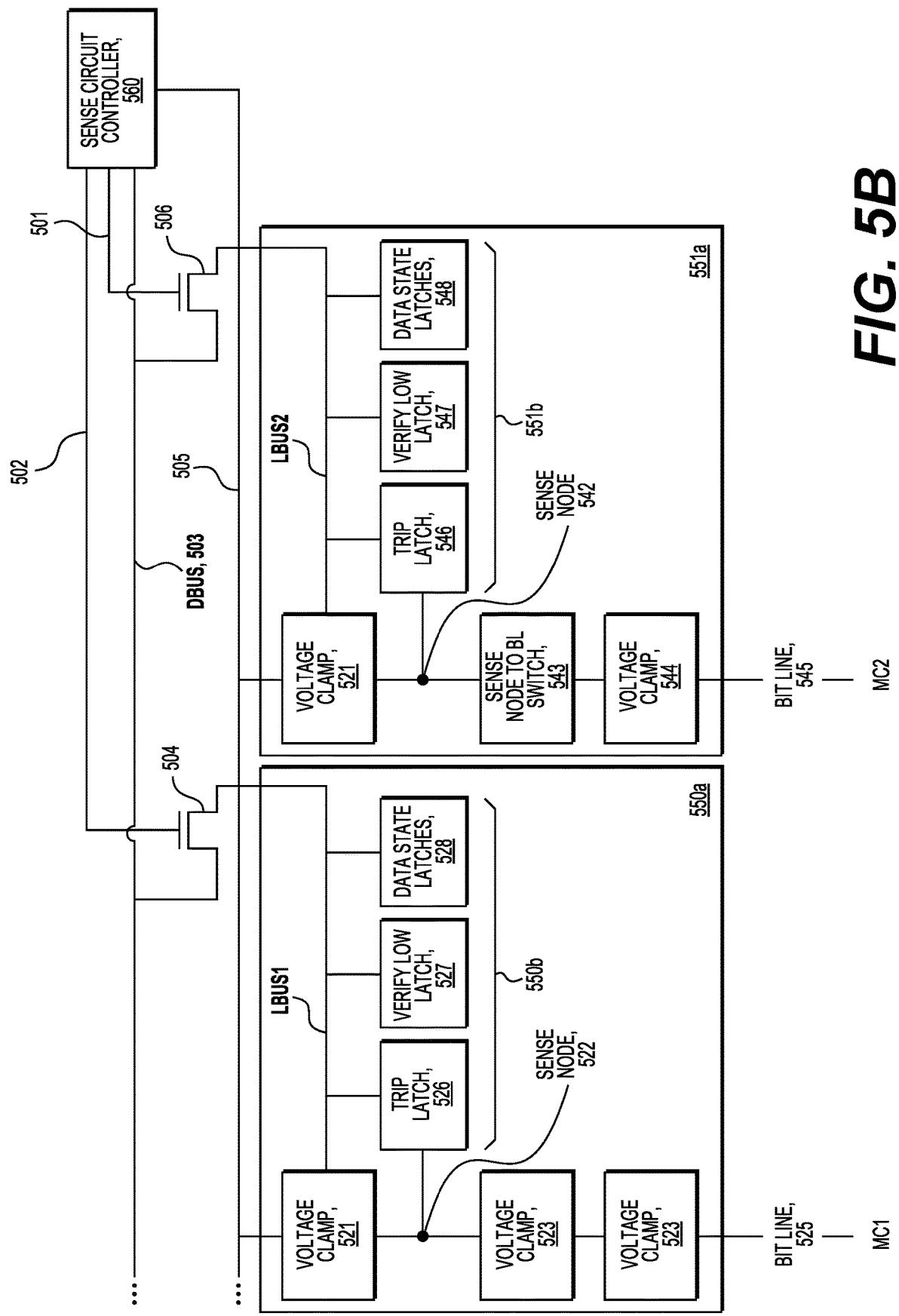
FIG. 5B depicts another example block diagram of the sense block SB1 of FIG. 1 according to aspects of the disclosure according to aspects of the disclosure.

FIG. 5B depicts another example block diagram of the sense block SB1 of FIG. 1. The sense circuit controller 560 communicates with multiple sense circuits including example sense circuits 550a and 551a, also shown in FIG. 5A. The sense circuit 550a includes latches 550b, including a trip latch 526, an offset verify latch 527 and data state latches 528. The sense circuit further includes a voltage clamp 521 such as a transistor which sets a pre-charge voltage at a sense node 522. A sense node to bit line (BL) switch 523 selectively allows the sense node to communicate with a bit line 525, e.g., the sense node is electrically connected to the bit line so that the sense node voltage can decay. The bit line 525 is connected to one or more memory cells such as a memory cell MC1. A voltage clamp 524 can set a voltage on the bit line, such as during a sensing operation or during a program voltage. A local bus, LBUS1, allows the sense circuit controller to communicate with components in the sense circuit, such as the latches 550b and the voltage clamp in some cases. To communicate with the sense circuit 550a, the sense circuit controller provides a voltage via a line 502 to a transistor 504 to connect LBUS1 with a data bus DBUS, 503. The communicating can include sending data to the sense circuit and/or receive data from the sense circuit.

The sense circuit controller can communicate with different sense circuits in a time-multiplexed manner, for instance. A line 505 may be connected to the voltage clamp in each sense circuit, in one approach.

The sense circuit 551a includes latches 551b, including a trip latch 546, an offset verify latch 547 and data state latches 548. A voltage clamp 541 may be used to set a pre-charge voltage at a sense node 542. A sense node to bit line (BL) switch 543 selectively allows the sense node to communicate with a bit line 545, and a voltage clamp 544 can set a voltage on the bit line. The bit line 545 is connected to one or more memory cells such as a memory cell MC2. A local bus, LBUS2, allows the sense circuit controller to communicate with components in the sense circuit, such as the latches 551b and the voltage clamp in some cases. To communicate with the sense circuit 551a, the sense circuit controller provides a voltage via a line 501 to a transistor 506 to connect LBUS2 with DBUS.

The sense circuit 550a may be a first sense circuit which comprises a first trip latch 526 and the sense circuit 551a may be a second sense circuit which comprises a second trip latch 546.

The sense circuit 550a is an example of a first sense circuit comprising a first sense node 522, where the first sense circuit is associated with a first memory cell MC1 and a first bit line 525. The sense circuit 551a is an example of a second sense circuit comprising a second sense node 542, where the second sense circuit is associated with a second memory cell MC2 and a second bit line 545.

Figure 6A:
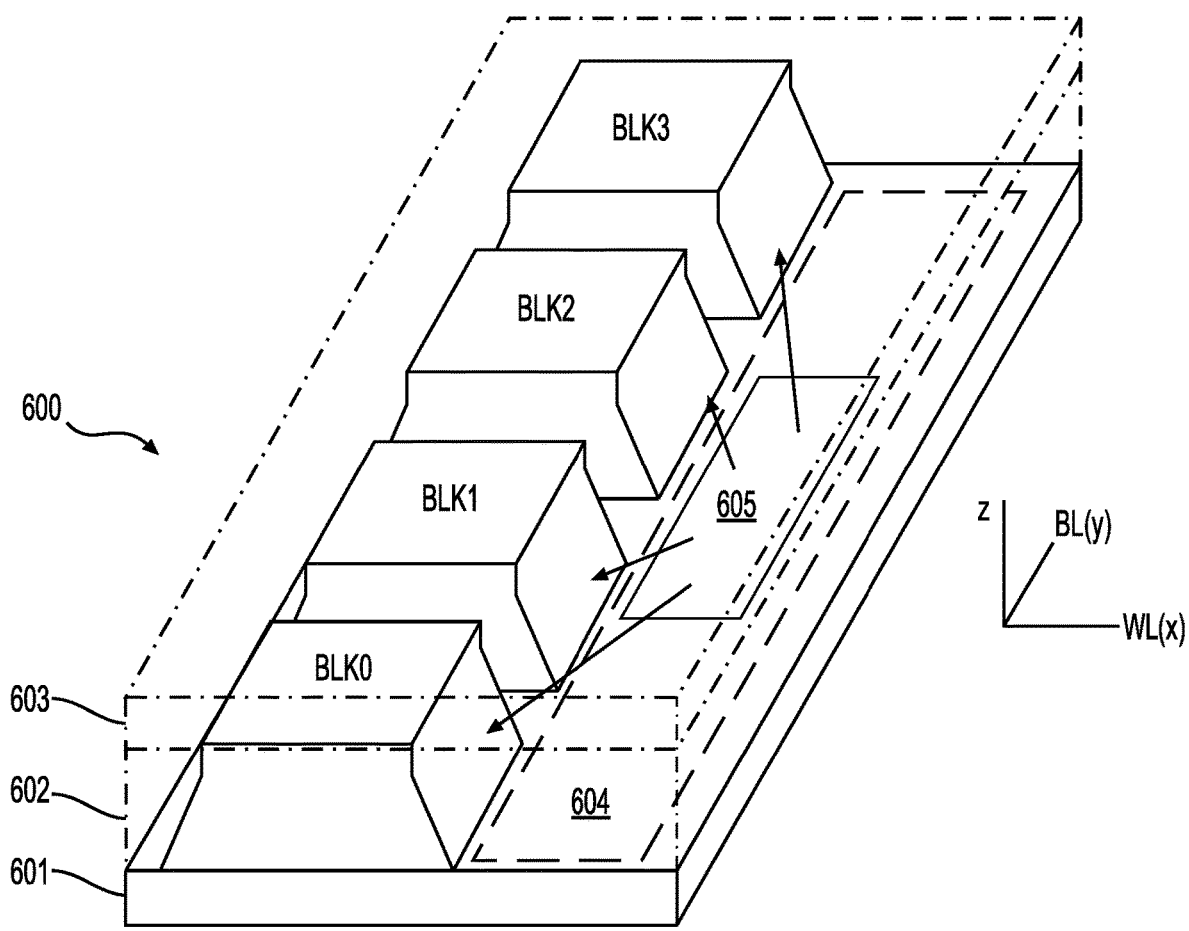
FIG. 6A is a perspective view of a set of blocks in an example three-dimensional configuration of the memory array of FIG. 1 according to aspects of the disclosure.

FIG. 6A is a perspective view of a set of blocks 600 in an example three-dimensional configuration of the memory array 126 of FIG. 1. On the substrate are example blocks BLK0, BLK1, BLK2 and BLK3 of memory cells (storage elements) and a peripheral area 604 with circuitry for use by the blocks. For example, the circuitry can include voltage drivers 605 which can be connected to control gate layers of the blocks. In one approach, control gate layers at a common height in the blocks are commonly driven. The substrate 601 can also carry circuitry under the blocks, along with one or more lower metal layers which are patterned in conductive paths to carry signals of the circuitry. The blocks are formed in an intermediate region 602 of the memory device. In an upper region 603 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
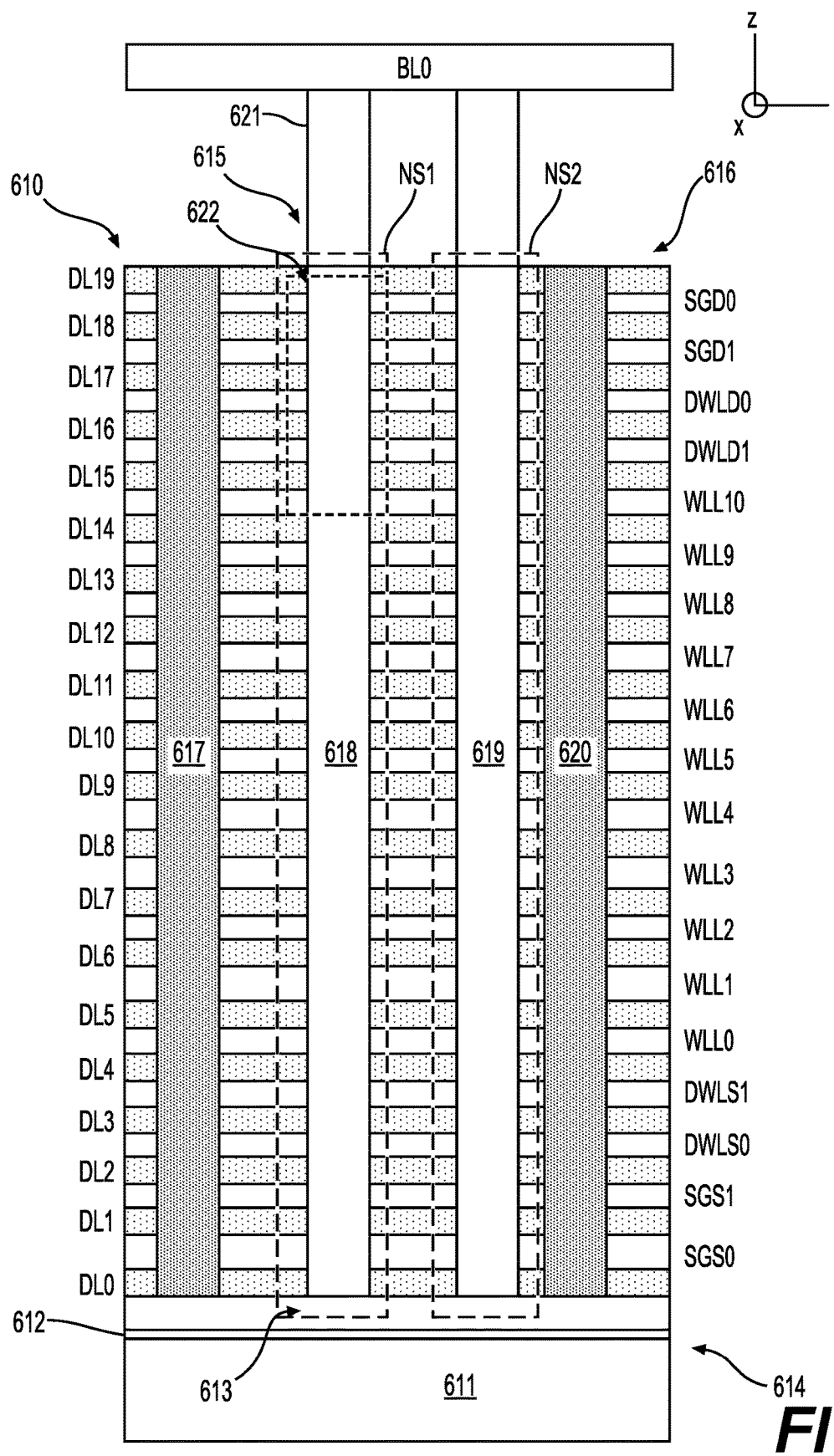
FIG. 6B depicts an example cross-sectional view of a portion of one of the blocks of FIG. 6A according to aspects of the disclosure.

FIG. 6B depicts an example cross-sectional view of a portion of one of the blocks of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack which comprise NAND strings NS1 and NS2 are depicted. Each NAND string encompasses a memory hole 618 or 619 which is filled with materials which form memory cells adjacent to the word lines. A region 622 of the stack is shown in greater detail in FIG. 6D.

The stack includes a substrate 611, an insulating film 612 on the substrate, and a portion of a source line SL. NS1 has a source-end 613 at a bottom 614 of the stack and a drain-end 615 at a top 616 of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

Figure 6C:
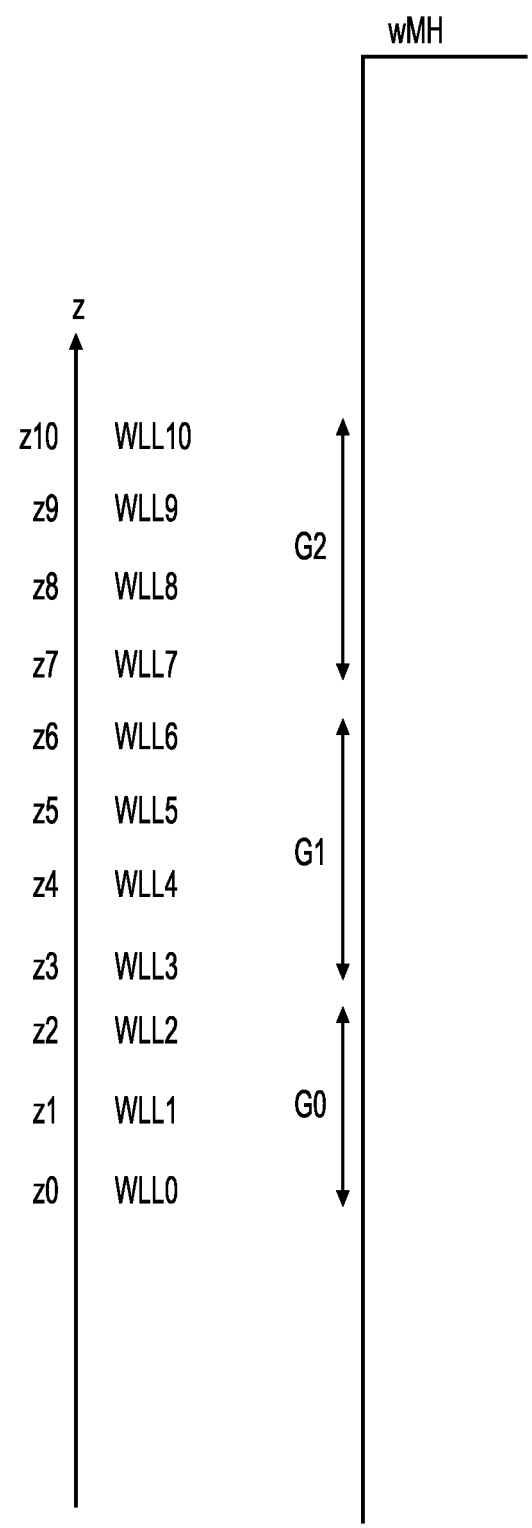
FIG. 6C depicts a plot of memory hole diameter in the stack of FIG. 6B according to aspects of the disclosure.

FIG. 6C depicts a plot of memory hole diameter in the stack of FIG. 6B. The vertical axis is aligned with the stack of FIG. 6B and depicts a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
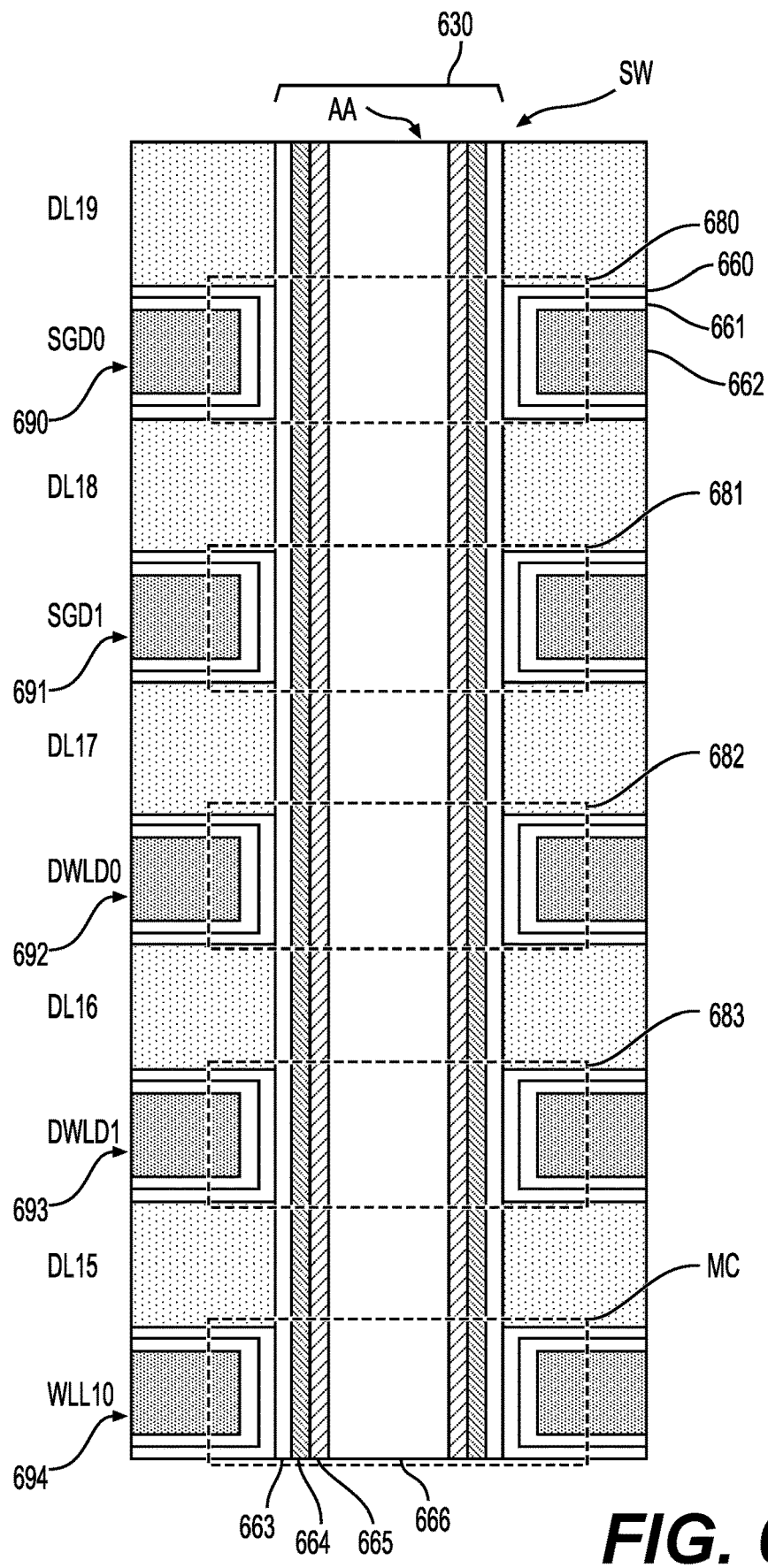
FIG. 6D depicts a close-up view of the region 622 of the stack of FIG. 6B according to aspects of the disclosure.

FIG. 6D depicts a close-up view of the region 622 of the stack of FIG. 6B. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7A:
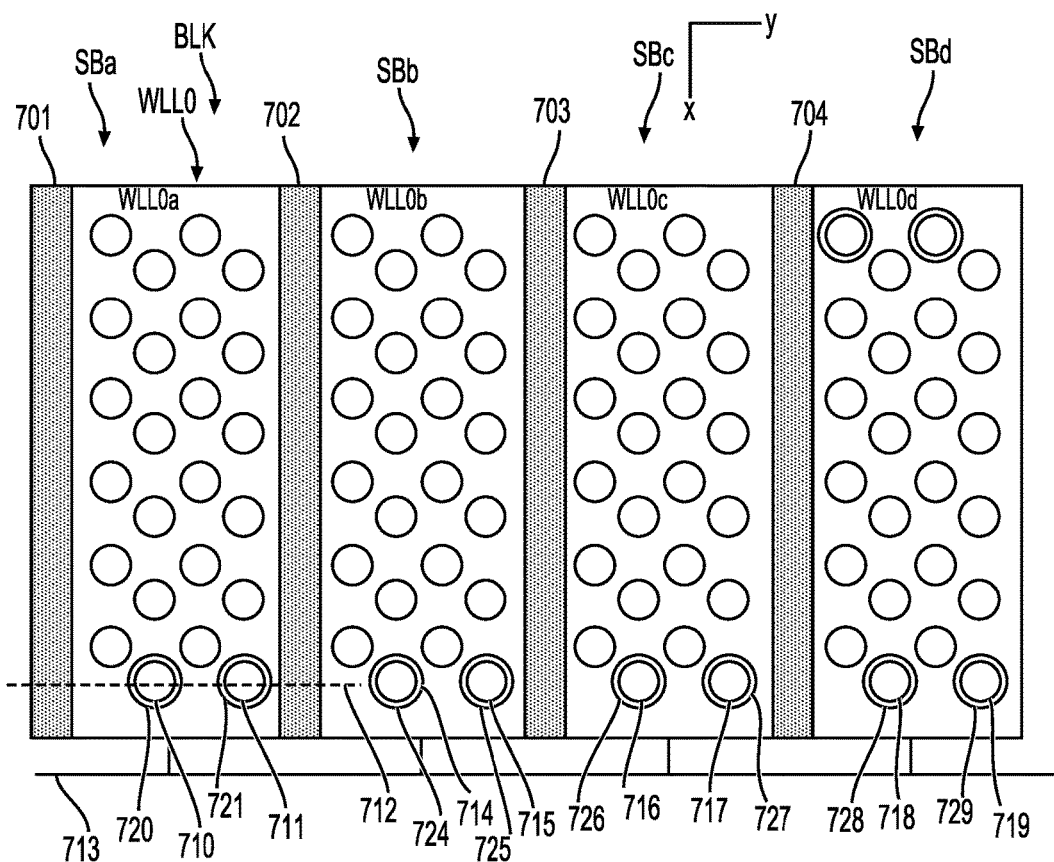
FIG. 7A depicts a top view of an example word line layer WLL0 of the stack of FIG. 6B according to aspects of the disclosure.

FIG. 7A depicts a top view of an example word line layer WLL0 of the stack of FIG. 6B. As mentioned, a 3D memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a 3D memory device can be divided into sub-blocks, where each sub-block comprises a set of NAND string which have a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block are can extend between slits which are formed periodically in the stack to process the word line layers during the fabrication process of the memory device. This processing can include replacing a sacrificial material of the word line layers with metal. Generally, the distance between slits should be relatively small to account for a limit in the distance that an etchant can travel laterally to remove the sacrificial material, and that the metal can travel to fill a void which is created by the removal of the sacrificial material. For example, the distance between slits may allow for a few rows of memory holes between adjacent slits. The layout of the memory holes and slits should also account for a limit in the number of bit lines which can extend across the region while each bit line is connected to a different memory cell. After processing the word line layers, the slits can optionally be filed with metal to provide an interconnect through the stack.

This figures and other are not necessarily to scale. In practice, the regions can be much longer in the x-direction relative to the y-direction than is depicted to accommodate additional memory holes.

Figure 7B:
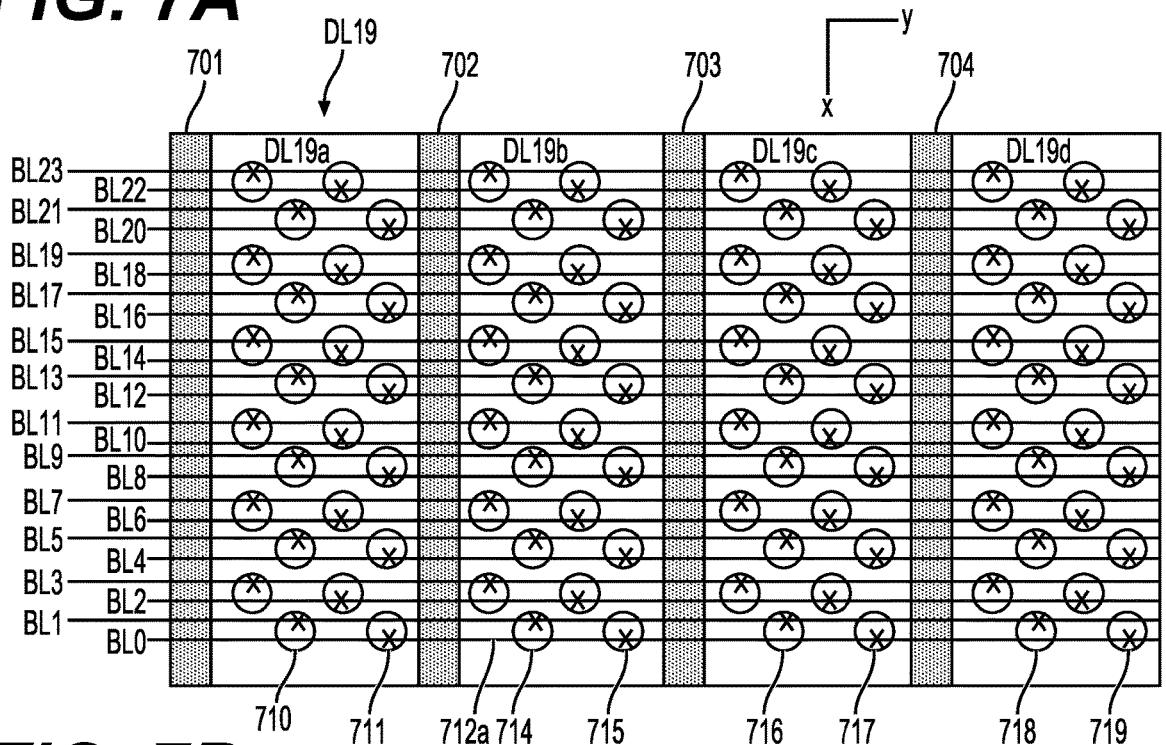
FIG. 7B depicts a top view of an example top dielectric layer DL19 of the stack of FIG. 6B according to aspects of the disclosure.

In this example, there are four rows of memory holes between adjacent slits. A row here is a group of memory holes which are aligned in the x-direction. Moreover, the rows of memory holes are in a staggered pattern to increase the density of the memory holes. The word line layer or word line is divided into regions WLL0 a, WLL0 b, WLL0 c and WLL0 d which are each connected by a connector 713. The last region of a word line layer in a block can be connected to a first region of a word line layer in a next block, in one approach. The connector, in turn, is connected to a voltage driver for the word line layer. The region WLL0 a has example memory holes 710 and 711 along a line 712. The region WLL0 b has example memory holes 714 and 715. The region WLL0 c has example memory holes 716 and 717. The region WLL0 d has example memory holes 718 and 719. The memory holes are also shown in FIG. 7B. Each memory hole can be part of a respective NAND string. For example, the memory holes 710, 714, 716 and 718 can be part of NAND strings NS0_SBa, NS0_SBb, NS0_SBc and NS0_SBd, respectively.

Each circle represents the cross-section of a memory hole at a word line layer or SG layer. Example circles shown with dashed lines represent memory cells which are provided by the materials in the memory hole and by the adjacent word line layer. For example, memory cells 720 and 721 are in WLL0 a, memory cells 724 and 725 are in WLL0 b, memory cells 726 and 727 are in WLL0 c, and memory cells 728 and 729 are in WLL0 d. These memory cells are at a common height in the stack.

Metal-filled slits 701, 702, 703 and 704 (e.g., metal interconnects) may be located between and adjacent to the edges of the regions WLL0 a-WLL0 d. The metal-filled slits provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 8A for further details of the sub-blocks SBa-SBd of FIG. 7A.

FIG. 7B depicts a top view of an example top dielectric layer DL19 of the stack of FIG. 6B. The dielectric layer is divided into regions DL19 a, DL19 b, DL19 c and DL19 d. Each region can be connected to a respective voltage driver. This allows a set of memory cells in one region of a word line layer to be programmed concurrently, with each memory cell being in a respective NAND string which is connected to a respective bit line. A voltage can be set on each bit line to allow or inhibit programming during each program voltage.

The region DL19 a has the example memory holes 710 and 711 along a line 712a which is coincident with a bit line BL0. A number of bit lines extend above the memory holes and are connected to the memory holes as indicated by the "X" symbols. BL0 is connected to a set of memory holes which includes the memory holes 711, 715, 717 and 719. Another example bit line BL1 is connected to a set of memory holes which includes the memory holes 710, 714, 716 and 718. The metal-filled slits 701, 702, 703 and 704 from FIG. 7A are also depicted, as they extend vertically through the stack. The bit lines can be numbered in a sequence BL0-BL23 across the DL19 layer in the −x direction.

Different subsets of bit lines are connected to cells in different rows. For example, BL0, BL4, BL8, BL12, BL16 and BL20 are connected to cells in a first row of cells at the right hand edge of each region. BL2, BL6, BL10, BL14, BL18 and BL22 are connected to cells in an adjacent row of cells, adjacent to the first row at the right hand edge. BL3, BL7, BL11, BL15, BL19 and BL23 are connected to cells in a first row of cells at the left hand edge of each region. BL1, BL5, BL9, BL13, BL17 and BL21 are connected to cells in an adjacent row of cells, adjacent to the first row at the left hand edge.

Figure 8A:
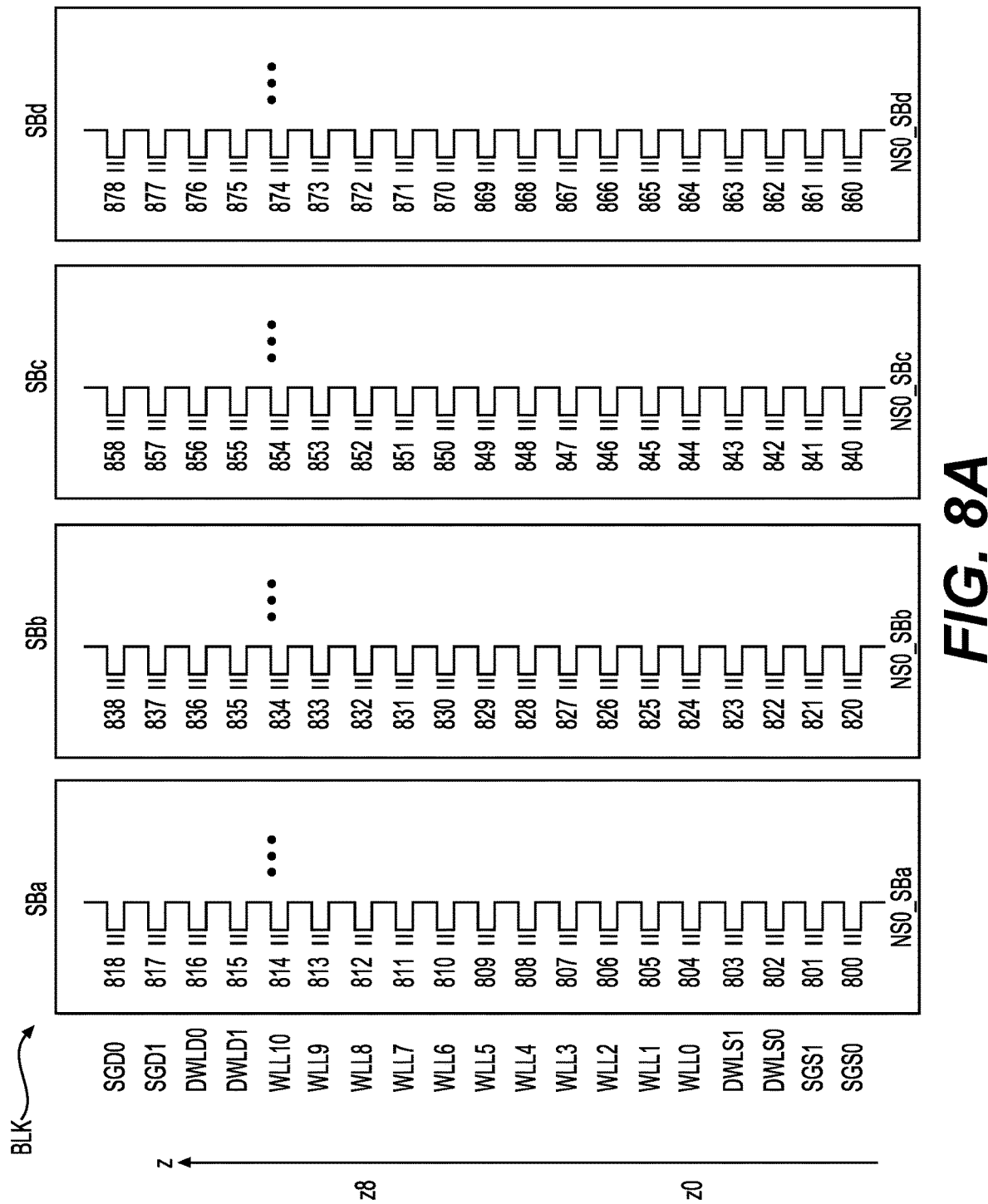
FIG. 8A depicts example NAND strings in the sub-blocks SBa-SBd of FIG. 7A according to aspects of the disclosure.

FIG. 8A depicts example NAND strings in the sub-blocks SBa-SBd of FIG. 7A. The sub-blocks are consistent with the structure of FIG. 6B. The conductive layers in the stack are depicted for reference at the left hand side. Each sub-block includes multiple NAND strings, where one example NAND string is depicted. For example, SBa comprises an example NAND string NS0_SBa, SBb comprises an example NAND string NS0_SBb, SBc comprises an example NAND string NS0_SBc, and SBd comprises an example NAND string NS0_SBd.

Additionally, NS0_SBa include SGS transistors 800 and 801, dummy memory cells 802 and 803, data memory cells 804, 805, 806, 807, 808, 809, 810, 811, 812, 813 and 814, dummy memory cells 815 and 816, and SGD transistors 817 and 818.

NS0_SBb include SGS transistors 820 and 821, dummy memory cells 822 and 823, data memory cells 824, 825, 826, 827, 828, 829, 830, 831, 832, 833 and 834, dummy memory cells 835 and 836, and SGD transistors 837 and 838.

NS0_SBc include SGS transistors 840 and 841, dummy memory cells 842 and 843, data memory cells 844, 845, 846, 847, 848, 849, 850, 851, 852, 853 and 854, dummy memory cells 855 and 856, and SGD transistors 857 and 858.

NS0_SBd include SGS transistors 860 and 861, dummy memory cells 862 and 863, data memory cells 864, 865, 866, 867, 868, 869, 870, 871, 872, 873 and 874, dummy memory cells 875 and 876, and SGD transistors 877 and 878.

At a given height in the block, a set of memory cells in each sub-block are at a common height. For example, one set of memory cells (including the memory cell 804) is among a plurality of memory cells formed along tapered memory holes in a stack of alternating conductive and dielectric layers. The one set of memory cells is at a particular height z0 in the stack. Another set of memory cells (including the memory cell 824) connected to the one word line (WLL0) are also at the particular height. In another approach, the another set of memory cells (e.g., including the memory cell 812) connected to another word line (e.g., WLL8) are at another height (z8) in the stack.

Figure 8B:
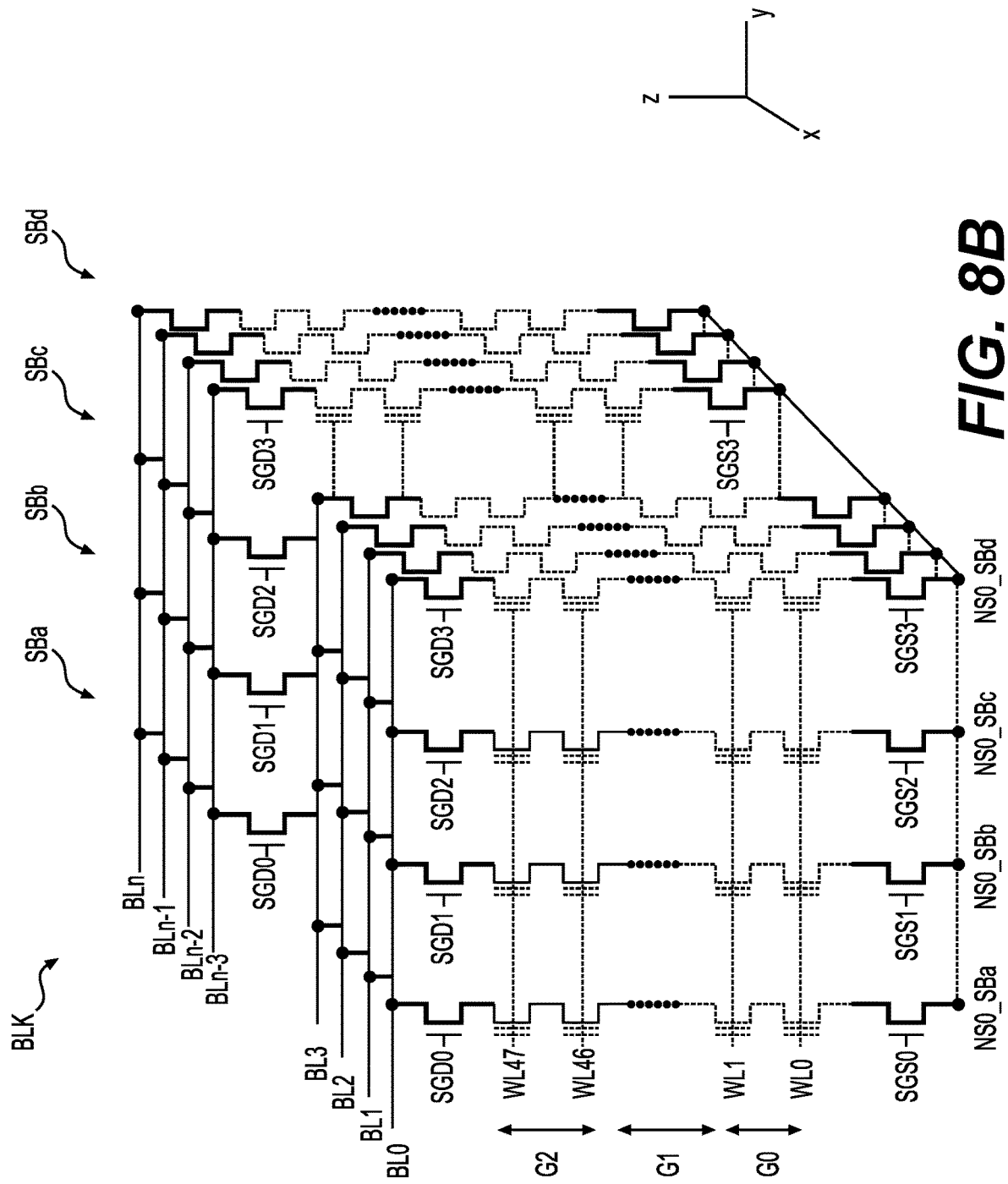
FIG. 8B depicts another example view of NAND strings in sub-blocks according to aspects of the disclosure.

FIG. 8B depicts another example view of NAND strings in sub-blocks. The NAND strings includes NS0_SBa, NS0_SBb, NS0_SBc and NS0_SBd, which have 48 word lines, WL0-WL47, in this example. Each sub-block comprises a set of NAND strings which extend in the x direction and which have a common SGD line, e.g., SGD0, SGD1, SGD2 or SGD3. In this simplified example, there is only one SGD transistor and one SGS transistor in each NAND string. The NAND strings NS0_SBa, NS0_SBb, NS0_SBc and NS0_SBd are in sub-blocks SBa, SBb, SBc and SBd, respectively. Further, example, groups of word lines G0, G1 and G2 are depicted.

Particularly in a three-dimensional memory arrangement, the natural Vth distribution can vary for different word lines within a memory block because the layers may have differing memory hole diameters. Thus, it is advantageous to perform a smart verify operation during programming in order to determine the optimal programming voltage for any given word line and avoid either under programming or over programming.

Figure 12:
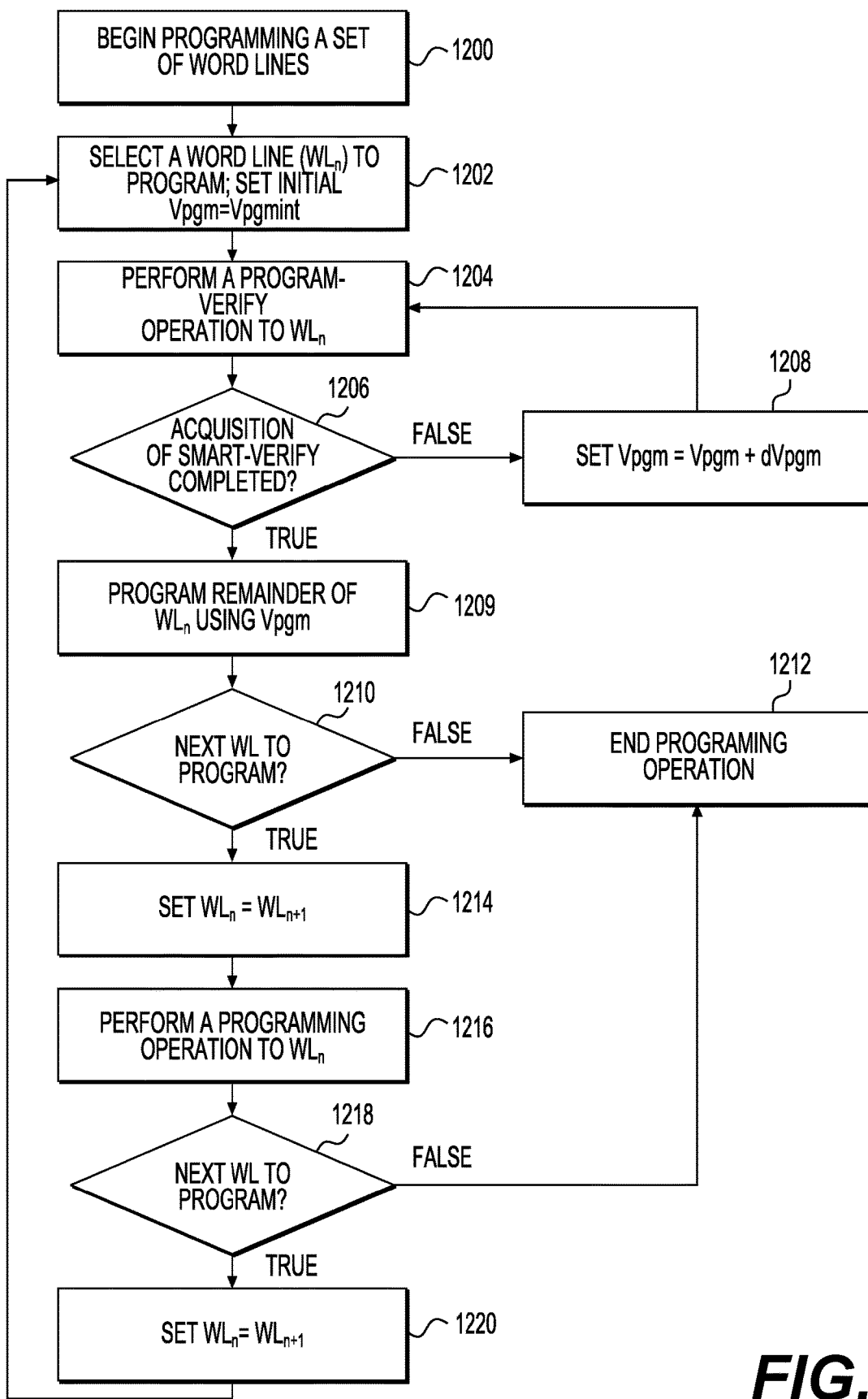
FIG. 12 is a flowchart of an example programming operation in a memory device according to aspects of the disclosure.

FIG. 12 is a flowchart of an example programming operation in a memory device. Step 1200 begins a programming operation for a set of word lines or for at least one word line. Step 1202 selects a page to program (for example, word line [$WL_n$]) and sets Vpgm to a predetermined initial program voltage (Vpgmint). In one example, Vpgmint is fourteen Volts (14 V).

Step 1204 performs a program-verify iteration which includes applying Vpgm to at least some of the cells coupled to $WL_n$ in a programming operation and applying a verification signal (e.g., a voltage waveform) to $WL_n$ while performing verify tests, e.g., for one or more data states. The cells $WL_n$ which the program-verify iteration is applied to are preferably up to a predetermined checkpoint within $WL_n$. The predetermined checkpoint is preferably near the lowest state threshold voltage.

Decision step 1206 determines if acquisition of smart verify is completed, e.g., based on the results of the verify tests of step 1204. The acquisition may be done, for example, if all or nearly all of the cells of the word line have been programmed to the predetermined checkpoint within WLn. If decision step 1206 is false, then at step 1208, Vpgm is incrementally increased (i.e., stepped up) by a voltage step amount in the form of a predetermined delta program voltage (dVpgm), i.e., Vpgm is set to Vpgm+dVpgm. In one example, dVpgm is one half of a Volt (0.5 V). Next, the programming operation returns to step 1204 to conduct the next program-verify iteration. Each repetition of step 1204 until decision step 1206 is true is one smart-verify loop, which requires resources from the controller.

If decision step 1206 is true (the acquisition of smart verify was completed), then at step 1209, the remaining cells of $WL_n$ are programmed using the newly acquired Vpgm as a starting program voltage and any known program-verify sequence. A decision step 1210 then determines if there is a next word line to program. If decision step 1210 is false (there are no additional word lines to program), then the programming operation ends at step 1212. If decision step 1210 is true, then at step 1214, $WL_n$ is incrementally advanced to the next word line to be programmed, i.e., $WL_n$ is set to $WL_{n+1}$.

Step 1216 performs a programming operation which includes applying Vpgm to $WL_n$. The Vpgm which is applied at step 1216 is the Vpgm which ultimately was successful at step 1206, and thus, Vpgm at step 1216 may be equal to or greater than Vpgmint.

Decision step 1218 determines if there is a next word line to program. If decision step 1218 is false (there are no additional word lines to program), then the programming operation ends at step 1212. If decision step 1210 is true, then at step 1220, $WL_n$ is incrementally advanced to the next word line to be programmed ($WL_n$ is set to $WL_{n+1}$) and Vpgm is incrementally decreased (stepped down) by dVpgm (Vpgm is set to Vpgmint). The programming operation then returns to the program-verify operation at step 1202. In alternate embodiments, steps 1214, 1216, and 1218 may be repeated one or more times such that two or more wordlines are programmed using Vpgm prior to proceeding back to the program-verify operation of step 1202.

The following table illustrates an example plot showing the programming operation of FIG. 12 as applied to ten exemplary word lines ($WL_1$-$WL_{10}$).

| WL | Start Vpgm | Acquired Vpgm |
|---|---|---|
| 1 | Vpgmint | Vpgm($WL_1$) |
| 2 | Vpgm($WL_1$) | None |
| 3 | Vpgmint | Vpgm($WL_3$) |
| 4 | Vpgm($WL_3$) | None |
| 5 | Vpgmint | Vpgm($WL_5$) |
| 6 | Vpgm($WL_5$) | None |
| 7 | Vpgmint | Vpgm($WL_7$) |
| 8 | Vpgm($WL_7$) | None |
| 9 | Vpgmint | Vpgm($WL_9$) |
| 10 | Vpgm($WL_9$) | None |

In the above example, the cumulative number of smart verify loops which must be completed to successfully program these ten word lines is reduced as compared to other known programming operations which utilize a smart verify operation to minimize under programming and over programming. In other words, the programming operation optimizes the time to acquire the optimal programming voltages. Thus, the overall performance and the endurance of the memory device are both improved.

As discussed above, smart verify can help reduce program time by obtaining an acquired program voltage or smart verify programming voltage VPGM_SV from a sampling string to improve program speed during the programming of subsequent strings. Though, defects in the memory apparatus can cause the smart verify programming voltage VPGM_SV to be unreliable. For instance, abnormal high smart verify programming voltage VPGM_SV will causes over program issue, inducing potential data loss. In addition, abnormal low smart verify programming voltage VPGM_SV will induce a high tProg on the following several WLs, decreasing device performance.

FIG. 13 shows one smart verify algorithm used for triple level cell (TLC) programming. During TLC programming, smart verify is performed on sampling string (WLn string0) to obtain the smart verify programming voltage VPGM_SV. The obtained smart verify programming voltage VPGM_SV is then used for several following strings (WLn string1/2/3) as an initial program voltage VPGM. In a multi-plane mode, smart verify will adopt the acquired minimum smart verify programming voltage VPGM_SV (based on a minimum number of smart verify loops).

In addition, word line skip smart verify mode can be used to further reduce program time tProg (i.e., time required for the program operation). FIG. 14 shows an example smart verify operation utilizing word line skip smart verify. As shown, smart verify is performed on WL2n string0 and the obtained smart verify programming voltage VPGM_SV will be applied to WL2n string1/2/3 and W2n+1 string0/1/2/3. In addition, smart verify on WL4n string0 and used for WL4n string1/2/3 and WL4n+1/2/3 string0/1/2/3 may also be used to further reduce the program time tProg. For good blocks, program time tProg has been significantly reduced through enabling smart verify. However, with bad blocks with leaky word lines (e.g., those with short circuits), smart verify is prone to acquire an abnormal smart verify programming voltage VPGM_SV, such as an abnormal high smart verify programming voltage VPGM_SV and an abnormal low smart verify programming voltage VPGM_SV.

Figure 15:
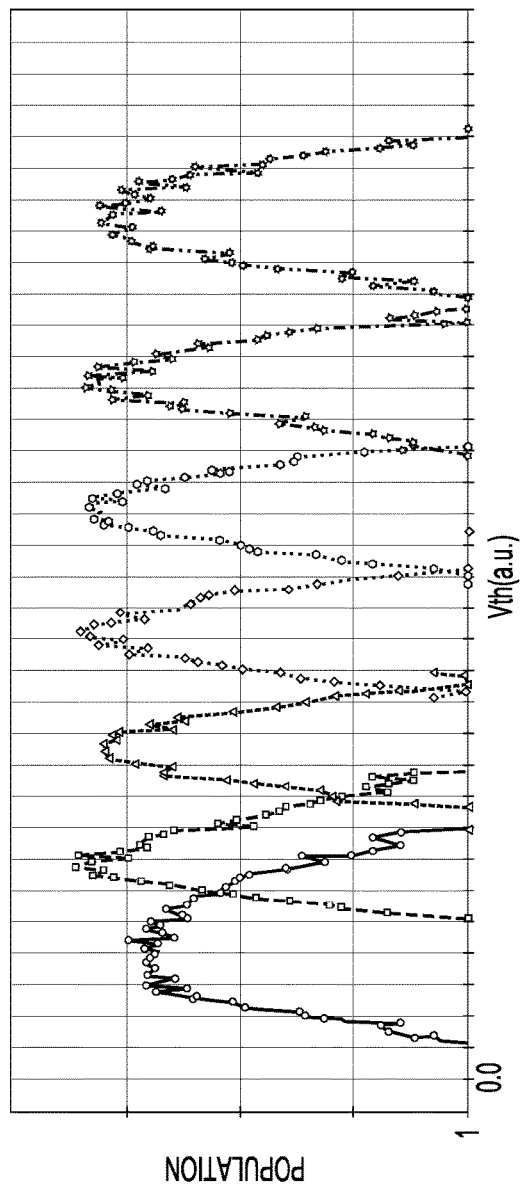
FIG. 15 shows a plot of threshold voltage illustrating an over program failure of an example memory apparatus according to aspects of the disclosure.

In an example word line leakage caused slow program issue on WL4n, more smart verify loops are required to pass smart verify and thus obtain an abnormal high smart verify programming voltage VPGM_SV. In a single-plane mode, when the acquired high smart verify programming voltage VPGM_SV is applied to WL4n+1/2/3, the word lines WL4n+1/2/3 will cause over program uncorrectable error correction code (UECC) failures on WL4n+1/2/3. FIG. 15 shows a plot of threshold voltage Vth illustrating an over program failure of an example memory apparatus. In contrast, these failed word lines WL4n+1/2/3 will show normal threshold voltage Vth by disabling smart verify. In multi-plane mode, smart verify will apply the minimum acquired smart verify programming voltage VPGM_SV for each plane. So the over program issue can be avoided for good blocks. However, in multi-plane mode, the program failure is prone to cause a neighbor plane disturb (NPD) issue. For instance, when Plane0 WL4n suffers from a severe word line leakage induced program failure, the program voltage VPGM of both Plane0 and Plane1 WL4n is pulled down, resulting a high number or quantity of smart verify loops to acquire the smart verify programming voltage VPGM_SV. As a result, Plane0 is terminated due to program failure. However, the acquired abnormal high smart verify programming voltage VPGM_SV will be applied on Plane1 WL4n+ 1/2/3, inducing an over program issue. FIG. 16 shows a plot of threshold voltage Vth illustrating another over program failure of the example memory apparatus. Even no program failure in multi-plane mode, a word line leakage induced slow program also will impact all planes, leading to a risk of over program failure.

In addition occurrences of the abnormal high smart verify programming voltage VPGM_SV, an abnormal low smart verify programming voltage VGPM_SV may also occur and increase program time tProg, thereby impacting device or apparatus performance. The abnormal low smart verify programming voltage VGPM_SV can occur when the smart verify acquisition string suffers from an erase tail (i.e., memory cells having a threshold voltage higher than what is typically expected after an erase operation). FIG. 17 shows a plot of threshold voltage Vth with an erase tail. It is known that F-degas induced word line-memory hole leakage tends to induce an erase tail. During smart verify acquisition (e.g., WL4n/string0), the existence of the erase tail on the smart verify acquisition string will induce an abnormal low smart verify programming voltage VGPM_SV, since smart verify can pass at the first smart verify loop. As a result, WL4n+ 1/2/3 will start program from an abnormal low smart verify programming voltage VPGM_SV and their required number of program loops is around 2-3 loops higher than normal VPGM_SV condition. On one hand, this abnormal low smart verify programming voltage VPGM_SV will cause a high program time tProg (e.g., impacts four word lines), decreasing program performance. On the other hand, this abnormal low smart verify programming voltage VPGM_SV also will cause a risk of program failure. For instance, some word line layers (e.g., at CDB) are prone to show slow program. Thus, an abnormal low smart verify programming voltage VPGM_SV will aggravate the slow program issue, inducing program failure risk.

In the multi-plane mode, as long as one plane acquired suffers from erase tail issue, the abnormal low smart verify programming voltage VPGM_SV will occur and applied in few word lines. So there is more concern about abnormal low smart verify programming voltage VGPM_SV in four-plane mode.

The judgement of smart verify pass/fail of TLC program can, for example, be based on a max program loop criteria (NLP_U). Yet, NLP_U is not an ideal criteria for smart verify pass/fail judgement, since it is too relaxed and prone to induce abnormal high smart verify programming voltage VPGM_SV and over program failure. Typically, no applied countermeasure to contain abnormal low smart verify programming voltage VPGM_SV is utilized.

Figure 18:
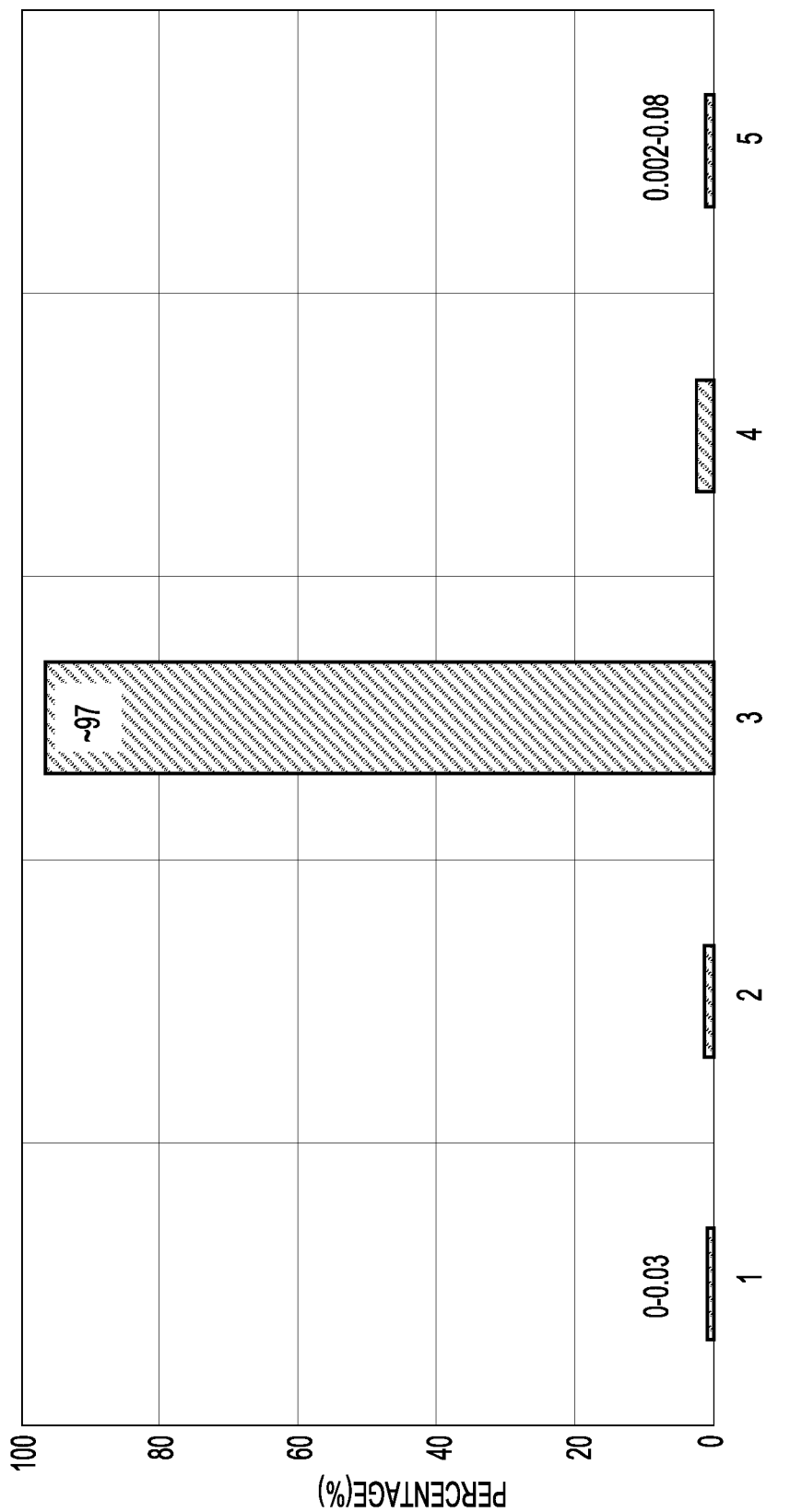
FIG. 18 shows a distribution of the quantity of smart verify loops of an example memory apparatus according to aspects of the disclosure.

FIG. 18 shows a distribution of the quantity of smart verify loops of an example memory apparatus. As shown, the required quantity of smart verify loops is frequently in the range of 2-4 loops (around 97% smart verify loops are 3 loops). Typically, no more than 6 smart verify loops are needed for good blocks. However, abnormal high smart verify loops, for instance 7 loops, are usually only observed in some bad blocks with program failure status.

Since the unreliable smart verify programming voltage VPGM_SV tends to impact serval word lines, the induced over program is prone to cause system DPPM and the increased program time tProg will decrease device performance. Therefore, countermeasures are needed to prevent abnormal smart verify failures in user mode insuring the acquisition of reliable smart verify programming voltage VPGM_SV.

Consequently, described herein is a memory apparatus (e.g., memory device 100 of FIG. 1A) including memory cells (e.g., data memory cell MC and dummy memory cells 682, 683 of FIG. 6D) connected to one of a plurality of word lines (e.g., data word line layers (word lines) WLL0-WLL10 of FIG. 6B or WLL10 of FIG. 6D). The memory cells are disposed in memory holes (e.g., memory holes 618 and 619 of FIG. 6B) and are configured to retain a threshold voltage Vt or Vth corresponding to one of a plurality of memory or data states (FIGS. 9-11). The memory holes are organized in rows grouped in a plurality of strings Str0, Str1, Str2, Str3. The memory apparatus also includes a control circuit or means (e.g., one or any combination of control circuitry 110, decoders 114/132, power control module 116, sense blocks SB1, SB2, . . . , SBp, read/write circuits 128, controller 122 of FIG. 1A, control circuit 150 of FIG. 1B, and/or sense circuit controller 560 of FIG. 5A and so forth) coupled to the plurality of word lines and the memory holes. The control means is configured to start the program operation. The control means is also configured to program the memory cells connected to one of the plurality of word lines and associated with a first one of the plurality of strings Str0, Str1, Str2, Str3 in a program operation and acquire a smart verify programming voltage VPGM_SV in a smart verify operation including a plurality of smart verify loops. The control means also determines the quantity of the plurality of smart verify loops needed to complete programming of the memory cells associated with the first one of the plurality of strings Str0, Str1, Str2, Str3. According to an aspect, the memory apparatus further includes a state machine (e.g., state machine 112 of FIG. 1A) configured to output the quantity of the plurality of smart verify loops and the control means is further configured to receive the quantity of the plurality of smart verify loops from the state machine. In addition, the control means is configured to discard the smart verify programming voltage VPGM_SV and determine another smart verify programming voltage VPGM_SV in another smart verify operation on the memory cells associated with a second one of the plurality of strings Str0, Str1, Str2, Str3 in response to a quantity of the plurality of smart verify loops needed to complete programming of the memory cells associated with the first one of the plurality of strings Str0, Str1, Str2, Str3 being outside a predetermined threshold criteria.

So, the memory apparatus and method disclosed herein identifies and discards an unreliable smart verify programming voltage VPGM_SV. If the final smart verify programming voltage VPGM_SV is acquired by one of the plurality of smart verify loops out of the pre-defined criteria, the acquired smart verify programming voltage VPGM_SV will not be used and such an event reflected in a status table by the state machine. Meanwhile, a re-start of smart verify acquisition will be triggered at a next one of the plurality of strings.

As discussed above, the control means is further configured to determine the smart verify programming voltage VPGM_SV in the smart verify operation by performing at least one program-verify iteration of at least some of the memory cells connected to the one of the plurality of word lines and associated with the first one of the plurality of strings Str0, Str1, Str2, Str3 using a voltage value which starts as a predetermined first initial voltage and is sequentially increased in each of the plurality of smart verify loops by a voltage step amount following each failure to successfully program until programming of the memory cells connected to the one of the plurality of word lines and associated with the first one of the plurality of strings Str0, Str1, Str2, Str3 is completed. The smart verify programming voltage VPGM_SV is the voltage value when the programming of the memory cells connected to the one of the plurality of word lines and associated with the first one of the plurality of strings Str0, Str1, Str2, Str3 is completed. The control means is also configured to program at least some of the memory cells connected to at least another one of the plurality of word lines using the smart verify programming voltage VPGM_SV acquired in the smart verify operation as a starting program voltage for programming. According to an aspect, the control means is further configured to program at least some of the memory cells associated with at least another one of the plurality of strings Str0, Str1, Str2, Str3 using the smart verify programming voltage VPGM_SV acquired in the smart verify operation as the starting program voltage for programming.

FIG. 19 shows a table including predetermined threshold criteria used to evaluate the quantity of the plurality of smart verify loops. More specifically, two parameters may be used as the predetermined threshold criteria to judge whether the smart verify programming voltage VPGM_SV that is acquired is reliable or not. So, the predetermined threshold criteria includes a predetermined upper loop quantity threshold NLP_SV_U and a predetermined lower loop quantity threshold NLP_SV_L. Thus, the control means is further configured to determine whether the quantity of the plurality of smart verify loops is greater than or equal to the predetermined upper loop quantity threshold NLP_SV_U. The control means is also configured to determine whether the quantity of the plurality of smart verify loops is less than or equal to the predetermined lower loop quantity threshold NLP_SV_L in response to the quantity of the plurality of smart verify loops not being greater than or equal to the predetermined upper loop quantity threshold NLP_SV_U. The control means is additionally configured to end the program operation in response to the quantity of the plurality of smart verify loops not being less than or equal to the predetermined lower loop quantity threshold NLP_SV_L.

Referring back to FIG. 6B, for example, the plurality of word lines (e.g., word line layers (word lines) WLL0-WLL10 of FIG. 6B) and a plurality of dielectric layers (e.g., DL0-DL19 of FIG. 6B) extend horizontally and overlay one another in an alternating fashion in a stack (e.g., stack 610) and the memory holes or strings (e.g., NAND strings NS1 and NS2 of FIG. 6B) extend vertically through the stack. In addition, the plurality of strings Str0, Str1, Str2, Str3 comprise each of a plurality blocks. The plurality of blocks comprise each of a plurality of planes. Thus, the control means is further configured to determine whether a leak detection operation should be triggered in response to the quantity of the plurality of smart verify loops being greater than or equal to the predetermined upper loop quantity threshold NLP_SV_U. The control means is also configured to determine whether the leak detection operation should be triggered in response to the quantity of the plurality of smart verify loops being less than or equal to the predetermined lower loop quantity threshold NLP_SV_L. The control means checks for leaks involving the memory cells connected to the one of the plurality of word lines and associated with the first one of the plurality of strings Str0, Str1, Str2, Str3 in one of the plurality of planes in the leak detection operation in response to determining the leak detection operation should be triggered.

In other words, a single word line smart verify leakage detection (e.g., CGRV_LD) can be performed on the word line with the unreliable smart verify programming voltage VPGM_SV, to detect the potential defects and disable leakage detection failed plane. According to an aspect, for each word line, the single word line smart verify leakage detection will be performed no more than once to reduce its impact on the program time tProg. For instance, a smart verify word line leak detection flag (e.g., SV_WLLD_FLAG) can be used to determine whether to trigger single word line smart verify leakage detection. At the beginning of one word line program (e.g., for WLn string0), the smart verify word line leak detection flag is initialized as 0. If acquired final smart verify loop for WLn string0 is out of the defined criteria, then the single word line smart verify leakage detection will be triggered to detect leakage of WLn and set the smart verify word line leak detection flag as 1, indicating leakage detection is done for WLn. Thus, even more strings of WLn show an abnormal quantity of smart verify loops, it will not trigger the single word line smart verify leakage detection to detect WLn again. For the program of a next word line WLn+1, the smart verify word line leak detection flag will be refreshed as 0. As a result, if a new abnormal SV loop occurred at WLn+1, the single word line smart verify leakage detection will trigger to detect WLn+1 and then and then the smart verify word line leak detection flag for WLn+1 becomes 1.

In more detail, the control means is further configured to determine whether the one of the plurality of planes failed the leak detection operation. The control means then disables the one of the plurality of planes in response to determining the one of the plurality of planes failed the leak detection operation. The control means is also configured to discard the smart verify programming voltage VPGM_SV in response to determining the leak detection operation should not be triggered. The control means also discards the smart verify programming voltage VPGM_SV in response to determining the one of the plurality of planes failed the leak detection operation. Additionally, the control means is configured to determine the another smart verify programming voltage VPGM_SV in another smart verify operation on the memory cells associated with the second one of the plurality of strings Str0, Str1, Str2, Str3. The control means end the program operation following the determining another smart verify programming voltage VPGM_SV in the another smart verify operation on the memory cells associated with the second one of the plurality of strings Str0, Str1, Str2, Str3.

According to a further aspect, the control means is configured to determine a temperature of the memory apparatus and a location of the one of the plurality word lines in the stack. The control means is also configured to adjust at least one of the predetermined lower loop quantity threshold NLP_SV_L and the predetermined upper loop quantity threshold NLP_SV_U based on the temperature of the memory apparatus. The control means is then configured to adjust at least one of the predetermined lower loop quantity threshold NLP_SV_L and the predetermined upper loop quantity threshold NLP_SV_U based on the location of the one of the plurality word lines in the stack. Thus, a word line layer offset and temperature offset for the criteria of at least one of the predetermined lower loop quantity threshold NLP_SV_L and the predetermined lower loop quantity threshold NLP_SV_U can be utilized to more efficiently contain abnormal smart verify programming voltage VPGM_SV issue, especially as the number of word line layers (and potentially leaky word lines) greatly increases as newer memory apparatuses are designed.

Figure 20:
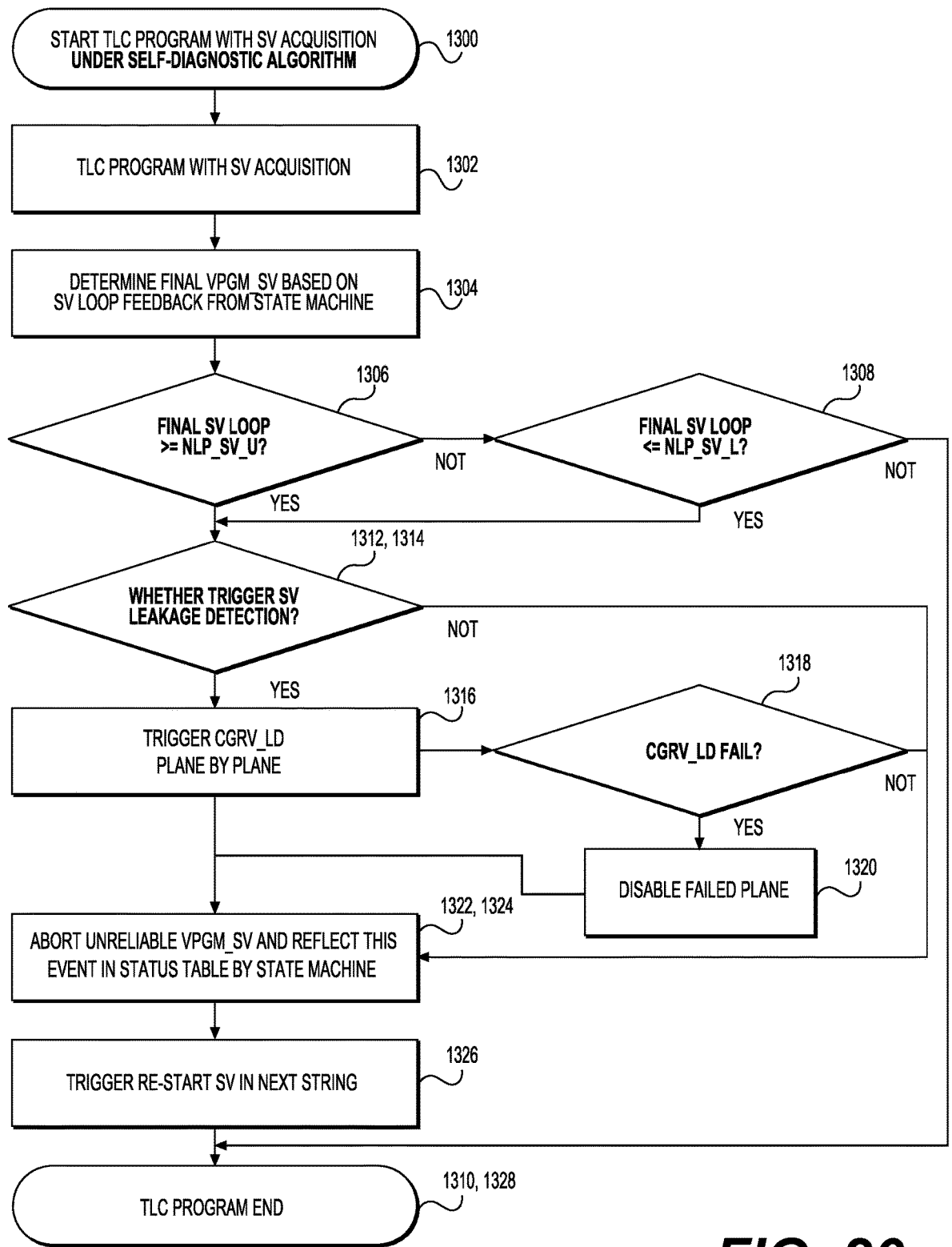
FIG. 20 illustrates steps of a method of operating a memory apparatus according to aspects of the disclosure.

FIG. 20 illustrates steps of a method of operating a memory apparatus. As discussed above, the memory apparatus (e.g., memory device 100 of FIG. 1A) includes including memory cells (e.g., data memory cell MC and dummy memory cells 682, 683 of FIG. 6D) connected to one of a plurality of word lines (e.g., data word line layers (word lines) WLL0-WLL10 of FIG. 6B or WLL10 of FIG. 6D). The memory cells are disposed in memory holes (e.g., memory holes 618 and 619 of FIG. 6B) and are configured to retain a threshold voltage Vt or Vth corresponding to one of a plurality of memory or data states (FIGS. 9-11). The memory holes are organized in rows grouped in a plurality of strings Str0, Str1, Str2, Str3. The method includes the step of 1300 starting the program operation. Next, 1302 programming the memory cells connected to one of the plurality of word lines and associated with a first one of the plurality of strings Str0, Str1, Str2, Str3 in a program operation and acquiring a smart verify programming voltage VPGM_SV in a smart verify operation including a plurality of smart verify loops. The next step of the method is 1304 determining the quantity of the plurality of smart verify loops needed to complete programming of the memory cells associated with the first one of the plurality of strings Str0, Str1, Str2, Str3.

As discussed above, the predetermined threshold criteria includes a predetermined upper loop quantity threshold NLP_SV_U and a predetermined lower loop quantity threshold NLP_SV_L. So, the method further includes the step of 1306 determining whether the quantity of the plurality of smart verify loops is greater than or equal to the predetermined upper loop quantity threshold NLP_SV_U. The method proceeds with the step of 1308 determining whether the quantity of the plurality of smart verify loops is less than or equal to the predetermined lower loop quantity threshold NLP_SV_L in response to the quantity of the plurality of smart verify loops not being greater than or equal to the predetermined upper loop quantity threshold NLP_SV_U. The method also includes the step of 1310 ending the program operation in response to the quantity of the plurality of smart verify loops not being less than or equal to the predetermined lower loop quantity threshold NLP_SV_L.

Again referring back to FIG. 6B, the plurality of word lines (e.g., word line layers (word lines) WLL0-WLL10 of FIG. 6B) and a plurality of dielectric layers (e.g., DL0-DL19 of FIG. 6B) extend horizontally and overlay one another in an alternating fashion in a stack (e.g., stack 610) and the memory holes or strings (e.g., NAND strings NS1 and NS2 of FIG. 6B) extend vertically through the stack. In addition, the plurality of strings Str0, Str1, Str2, Str3 comprise each of a plurality blocks. The plurality of blocks comprise each of a plurality of planes. Thus, as shown in FIG. 20, the method further includes the step of 1312 determining whether a leak detection operation should be triggered in response to the quantity of the plurality of smart verify loops being greater than or equal to the predetermined upper loop quantity threshold NLP_SV_U. The method continues with the step of 1314 determining whether the leak detection operation should be triggered in response to the quantity of the plurality of smart verify loops being less than or equal to the predetermined lower loop quantity threshold NLP_SV_L. The next step of the method is 1316 checking for leaks involving the memory cells connected to the one of the plurality of word lines and associated with the first one of the plurality of strings Str0, Str1, Str2, Str3 in one of the plurality of planes in the leak detection operation in response to determining the leak detection operation should be triggered. The method further includes the step of 1318 determining whether the one of the plurality of planes failed the leak detection operation. The method continues by 1320 disabling the one of the plurality of planes in response to determining the one of the plurality of planes failed the leak detection operation.

The method also includes discarding the smart verify programming voltage VPGM_SV and determining another smart verify programming voltage VPGM_SV in another smart verify operation on the memory cells associated with a second one of the plurality of strings Str0, Str1, Str2, Str3 in response to a quantity of the plurality of smart verify loops needed to complete programming of the memory cells associated with the first one of the plurality of strings Str0, Str1, Str2, Str3 being outside the predetermined threshold criteria. So, in more detail, the method includes the step of 1322 discarding the smart verify programming voltage VPGM_SV in response to determining the leak detection operation should not be triggered. The method continues with the step of 1324 discarding the smart verify programming voltage VPGM_SV in response to determining the one of the plurality of planes failed the leak detection operation. The next step of the method is 1326 determining the another smart verify programming voltage VPGM_SV in another smart verify operation on the memory cells associated with the second one of the plurality of strings Str0, Str1, Str2, Str3. The method also includes the step of 1328 ending the program operation following the determining another smart verify programming voltage VPGM_SV in the another smart verify operation on the memory cells associated with the second one of the plurality of strings Str0, Str1, Str2, Str3.

According to aspects of the disclosure, the method additionally includes the step of determining the smart verify programming voltage VPGM_SV in the smart verify operation by performing at least one program-verify iteration of at least some of the memory cells connected to the one of the plurality of word lines and associated with the first one of the plurality of strings Str0, Str1, Str2, Str3 using a voltage value which starts as a predetermined first initial voltage and is sequentially increased in each of the plurality of smart verify loops by a voltage step amount following each failure to successfully program until programming of the memory cells connected to the one of the plurality of word lines and associated with the first one of the plurality of strings Str0, Str1, Str2, Str3 is completed. The smart verify programming voltage VPGM_SV is the voltage value when the programming of the memory cells connected to the one of the plurality of word lines and associated with the first one of the plurality of strings Str0, Str1, Str2, Str3 is completed. The method continues with the step of programming at least some of the memory cells connected to at least another one of the plurality of word lines using the smart verify programming voltage VPGM_SV acquired in the smart verify operation as a starting program voltage for programming.

Again, the predetermined lower loop quantity threshold NLP_SV_L and the predetermined upper loop quantity threshold NLP_SV_U can based on the temperature of the memory apparatus and/or the location of word lines within the stack. Thus the method further includes the step of determining a temperature of the memory apparatus and a location of the one of the plurality word lines in the stack. The method also includes the step of adjusting at least one of the predetermined lower loop quantity threshold NLP_SV_L and the predetermined upper loop quantity threshold NLP_SV_U based on the temperature of the memory apparatus. In addition, the method includes the step of adjusting at least one of the predetermined lower loop quantity threshold NLP_SV_L and the predetermined upper loop quantity threshold NLP_SV_U based on the location of the one of the plurality word lines in the stack.

As discussed above, the memory apparatus can further include the state machine (e.g., state machine 112 of FIG. 1A) configured to output the quantity of the plurality of smart verify loops. So, the method further includes the step of receiving the quantity of the plurality of smart verify loops from the state machine at a control means.

The memory apparatus and method of operation disclosed herein provides numerous advantages. Specifically, the memory apparatus and method of operation disclosed herein not only can prevent abnormal high smart verify programming voltage VPGM_SV induced over programming failures, but also can prevent abnormal low smart verify programming voltage VPGM_SV caused high program time tProg issues. Thus, memory apparatus performance can be significantly improved.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Various terms are used to refer to particular system components. Different companies may refer to a component by different names—this document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

Additionally, when a layer or element is referred to as being "on" another layer or substrate, in can be directly on the other layer of substrate, or intervening layers may also be present. Further, it will be understood that when a layer is referred to as being "under" another layer, it can be directly under, and one or more intervening layers may also be present. Furthermore, when a layer is referred to as "between" two layers, it can be the only layer between the two layers, or one or more intervening layers may also be present.

As described herein, a controller includes individual circuit components, an application-specific integrated circuit (ASIC), a microcontroller with controlling software, a digital signal processor (DSP), a processor with controlling software, a field programmable gate array (FPGA), or combinations thereof.

What is claimed is:

1. A memory apparatus, comprising:
  memory cells connected to one of a plurality of word lines and disposed in memory holes and configured to retain a threshold voltage corresponding to one of a plurality of data states, the memory holes organized in rows grouped in a plurality of strings; and
  a control means coupled to the plurality of word lines and the memory holes and configured to:
    program the memory cells connected to one of the plurality of word lines and associated with a first one of the plurality of strings in a program operation and acquire a smart verify programming voltage in a smart verify operation including a plurality of smart verify loops, and
    discard the smart verify programming voltage and determine another smart verify programming voltage in another smart verify operation on the memory cells associated with a second one of the plurality of strings in response to a quantity of the plurality of smart verify loops needed to complete programming of the memory cells associated with the first one of the plurality of strings being outside a predetermined threshold criteria.

2. The memory apparatus as set forth in claim 1, wherein the control means is further configured to:
  determine the smart verify programming voltage in the smart verify operation by performing at least one program-verify iteration of at least some of the memory cells connected to the one of the plurality of word lines and associated with the first one of the plurality of strings using a voltage value which starts as a predetermined first initial voltage and is sequentially increased in each of the plurality of smart verify loops by a voltage step amount following each failure to successfully program until programming of the memory cells connected to the one of the plurality of word lines and associated with the first one of the plurality of strings is completed, the smart verify programming voltage being the voltage value when the programming of the memory cells connected to the one of the plurality of word lines and associated with the first one of the plurality of strings is completed; and
  program at least some of the memory cells connected to at least another one of the plurality of word lines using the smart verify programming voltage acquired in the smart verify operation as a starting program voltage for programming.

3. The memory apparatus as set forth in claim 2, wherein the control means is further configured to program at least some of the memory cells associated with at least another one of the plurality of strings using the smart verify programming voltage acquired in the smart verify operation as the starting program voltage for programming.

4. The memory apparatus as set forth in claim 2, wherein the predetermined threshold criteria includes a predetermined upper loop quantity threshold and a predetermined lower loop quantity threshold and the control means is further configured to:

determine whether the quantity of the plurality of smart verify loops is greater than or equal to the predetermined upper loop quantity threshold, determine whether the quantity of the plurality of smart verify loops is less than or equal to the predetermined lower loop quantity threshold in response to the quantity of the plurality of smart verify loops not being greater than or equal to the predetermined upper loop quantity threshold, and end the program operation in response to the quantity of the plurality of smart verify loops not being less than or equal to the predetermined lower loop quantity threshold.

5. The memory apparatus as set forth in claim 4, wherein the plurality of word lines and a plurality of dielectric layers extend horizontally and overlay one another in an alternating fashion in a stack, the memory holes extend vertically through the stack, the plurality of strings comprise each of a plurality blocks, the plurality of blocks comprise each of a plurality of planes, and the control means is further configured to:

determine whether a leak detection operation should be triggered in response to the quantity of the plurality of smart verify loops being greater than or equal to the predetermined upper loop quantity threshold, determine whether the leak detection operation should be triggered in response to the quantity of the plurality of smart verify loops being less than or equal to the predetermined lower loop quantity threshold, and check for leaks involving the memory cells connected to the one of the plurality of word lines and associated with the first one of the plurality of strings in one of the plurality of planes in the leak detection operation in response to determining the leak detection operation should be triggered.

6. The memory apparatus as set forth in claim 5, wherein the control means is further configured to:

start the program operation, determine the quantity of the plurality of smart verify loops needed to complete programming of the memory cells associated with the first one of the plurality of strings, determine whether the one of the plurality of planes failed the leak detection operation, disable the one of the plurality of planes in response to determining the one of the plurality of planes failed the leak detection operation, discard the smart verify programming voltage in response to determining the leak detection operation should not be triggered, discard the smart verify programming voltage in response to determining the one of the plurality of planes failed the leak detection operation, determine the another smart verify programming voltage in another smart verify operation on the memory cells associated with the second one of the plurality of strings, and end the program operation following the determining another smart verify programming voltage in the another smart verify operation on the memory cells associated with the second one of the plurality of strings.

7. The memory apparatus as set forth in claim 5, wherein the control means is configured to:

determine a temperature of the memory apparatus and a location of the one of the plurality word lines in the stack;

adjust at least one of the predetermined lower loop quantity threshold and the predetermined upper loop quantity threshold based on the temperature of the memory apparatus; and adjust at least one of the predetermined lower loop quantity threshold and the predetermined upper loop quantity threshold based on the location of the one of the plurality word lines in the stack.

8. The memory apparatus as set forth in claim 1, wherein the memory apparatus further includes a state machine configured to output the quantity of the plurality of smart verify loops and the control means is further configured to receive the quantity of the plurality of smart verify loops from the state machine.

9. A controller in communication with a memory apparatus including memory cells connected to one of a plurality of word lines and disposed in memory holes and configured to retain a threshold voltage corresponding to one of a plurality of data states, the memory holes organized in rows grouped in a plurality of strings, the controller configured to:

instruct the memory apparatus to program the memory cells connected to one of the plurality of word lines and associated with a first one of the plurality of strings in a program operation and acquire a smart verify programming voltage in a smart verify operation including a plurality of smart verify loops; and instruct the memory apparatus to discard the smart verify programming voltage and determine another smart verify programming voltage in another smart verify operation on the memory cells associated with a second one of the plurality of strings in response to a quantity of the plurality of smart verify loops needed to complete programming of the memory cells associated with the first one of the plurality of strings being outside a predetermined threshold criteria.

10. The controller as set forth in claim 9, wherein the controller is further configured to:

instruct the memory apparatus to determine the smart verify programming voltage in the smart verify operation by performing at least one program-verify iteration of at least some of the memory cells connected to the one of the plurality of word lines and associated with the first one of the plurality of strings using a voltage value which starts as a predetermined first initial voltage and is sequentially increased in each of the plurality of smart verify loops by a voltage step amount following each failure to successfully program until programming of the memory cells connected to the one of the plurality of word lines and associated with the first one of the plurality of strings is completed, the smart verify programming voltage being the voltage value when the programming of the memory cells connected to the one of the plurality of word lines and associated with the first one of the plurality of strings is completed; and instruct the memory apparatus to program at least some of the memory cells connected to at least another one of the plurality of word lines using the smart verify programming voltage acquired in the smart verify operation as a starting program voltage for programming.

11. The controller as set forth in claim 10, wherein the predetermined threshold criteria includes a predetermined upper loop quantity threshold and a predetermined lower loop quantity threshold and the controller is further configured to:
- determine whether the quantity of the plurality of smart verify loops is greater than or equal to the predetermined upper loop quantity threshold;
- determine whether the quantity of the plurality of smart verify loops is less than or equal to the predetermined lower loop quantity threshold in response to the quantity of the plurality of smart verify loops not being greater than or equal to the predetermined upper loop quantity threshold; and
- instruct the memory apparatus to end the program operation in response to the quantity of the plurality of smart verify loops not being less than or equal to the predetermined lower loop quantity threshold.

12. The controller as set forth in claim 11, wherein the memory apparatus includes the plurality of word lines and a plurality of dielectric layers extending horizontally and overlaying one another in an alternating fashion in a stack, the memory holes extend vertically through the stack, the plurality of strings comprise each of a plurality blocks, the plurality of blocks comprise each of a plurality of planes, and the controller is further configured to:
- determine whether a leak detection operation should be triggered in response to the quantity of the plurality of smart verify loops being greater than or equal to the predetermined upper loop quantity threshold,
- determine whether the leak detection operation should be triggered in response to the quantity of the plurality of smart verify loops being less than or equal to the predetermined lower loop quantity threshold, and
- instruct the memory apparatus to check for leaks involving the memory cells connected to the one of the plurality of word lines and associated with the first one of the plurality of strings in one of the plurality of planes in the leak detection operation in response to determining the leak detection operation should be triggered.

13. The controller as set forth in claim 12, wherein the controller is further configured to:
- instruct the memory apparatus to start the program operation,
- instruct the memory apparatus to determine the quantity of the plurality of smart verify loops needed to complete programming of the memory cells associated with the first one of the plurality of strings,
- instruct the memory apparatus to determine whether the one of the plurality of planes failed the leak detection operation,
- instruct the memory apparatus to disable the one of the plurality of planes in response to determining the one of the plurality of planes failed the leak detection operation,
- discard the smart verify programming voltage in response to determining the leak detection operation should not be triggered,
- discard the smart verify programming voltage in response to determining the one of the plurality of planes failed the leak detection operation,
- instruct the memory apparatus to determine the another smart verify programming voltage in another smart verify operation on the memory cells associated with the second one of the plurality of strings, and
- instruct the memory apparatus to end the program operation following the determining another smart verify programming voltage in the another smart verify operation on the memory cells associated with the second one of the plurality of strings.

14. A method of operating a memory apparatus including memory cells connected to one of a plurality of word lines and disposed in memory holes and configured to retain a threshold voltage corresponding to one of a plurality of data states, the memory holes organized in rows grouped in a plurality of strings, the method comprising the steps of:
- programming the memory cells connected to one of the plurality of word lines and associated with a first one of the plurality of strings in a program operation and acquiring a smart verify programming voltage in a smart verify operation including a plurality of smart verify loops; and
- discarding the smart verify programming voltage and determining another smart verify programming voltage in another smart verify operation on the memory cells associated with a second one of the plurality of strings in response to a quantity of the plurality of smart verify loops needed to complete programming of the memory cells associated with the first one of the plurality of strings being outside a predetermined threshold criteria.

15. The method as set forth in claim 14, further including the steps of:
- determining the smart verify programming voltage in the smart verify operation by performing at least one program-verify iteration of at least some of the memory cells connected to the one of the plurality of word lines and associated with the first one of the plurality of strings using a voltage value which starts as a predetermined first initial voltage and is sequentially increased in each of the plurality of smart verify loops by a voltage step amount following each failure to successfully program until programming of the memory cells connected to the one of the plurality of word lines and associated with the first one of the plurality of strings is completed, the smart verify programming voltage being the voltage value when the programming of the memory cells connected to the one of the plurality of word lines and associated with the first one of the plurality of strings is completed; and
- programming at least some of the memory cells connected to at least another one of the plurality of word lines using the smart verify programming voltage acquired in the smart verify operation as a starting program voltage for programming.

16. The method as set forth in claim 15, wherein the predetermined threshold criteria includes a predetermined upper loop quantity threshold and a predetermined lower loop quantity threshold and the method further includes the steps of:
- determining whether the quantity of the plurality of smart verify loops is greater than or equal to the predetermined upper loop quantity threshold;
- determining whether the quantity of the plurality of smart verify loops is less than or equal to the predetermined lower loop quantity threshold in response to the quantity of the plurality of smart verify loops not being greater than or equal to the predetermined upper loop quantity threshold; and
- ending the program operation in response to the quantity of the plurality of smart verify loops not being less than or equal to the predetermined lower loop quantity threshold.

17. The method as set forth in claim 16, wherein the memory apparatus includes the plurality of word lines and a plurality of dielectric layers extending horizontally and overlaying one another in an alternating fashion in a stack, the memory holes extend vertically through the stack, the plurality of strings comprise each of a plurality blocks, the plurality of blocks comprise each of a plurality of planes, and the method further includes the steps of:

determining whether a leak detection operation should be triggered in response to the quantity of the plurality of smart verify loops being greater than or equal to the predetermined upper loop quantity threshold;

determining whether the leak detection operation should be triggered in response to the quantity of the plurality of smart verify loops being less than or equal to the predetermined lower loop quantity threshold; and checking for leaks involving the memory cells connected to the one of the plurality of word lines and associated with the first one of the plurality of strings in one of the plurality of planes in the leak detection operation in response to determining the leak detection operation should be triggered.

18. The method as set forth in claim 17, further including the steps of:

starting the program operation;

determining the quantity of the plurality of smart verify loops needed to complete programming of the memory cells associated with the first one of the plurality of strings;

determining whether the one of the plurality of planes failed the leak detection operation;

disabling the one of the plurality of planes in response to determining the one of the plurality of planes failed the leak detection operation;

discarding the smart verify programming voltage in response to determining the leak detection operation should not be triggered;

discarding the smart verify programming voltage in response to determining the one of the plurality of planes failed the leak detection operation;

determining the another smart verify programming voltage in another smart verify operation on the memory cells associated with the second one of the plurality of strings; and ending the program operation following the determining another smart verify programming voltage in the another smart verify operation on the memory cells associated with the second one of the plurality of strings.

19. The method as set forth in claim 17, further including the steps of:

determining a temperature of the memory apparatus and a location of the one of the plurality word lines in the stack;

adjusting at least one of the predetermined lower loop quantity threshold and the predetermined upper loop quantity threshold based on the temperature of the memory apparatus; and adjusting at least one of the predetermined lower loop quantity threshold and the predetermined upper loop quantity threshold based on the location of the one of the plurality word lines in the stack.

20. The method as set forth in claim 14, wherein the memory apparatus further includes a state machine configured to output the quantity of the plurality of smart verify loops and the method further includes the step of receiving the quantity of the plurality of smart verify loops from the state machine at a control means.

* * * * *